US012751279B2

(12) United States Patent
Kwon et al.

(10) Patent No.: US 12,751,279 B2
(45) Date of Patent: Sep. 29, 2026

(54) SEMICONDUCTOR DEVICE AND ELECTRONIC SYSTEM INCLUDING SEMICONDUCTOR DEVICE

(71) Applicant: Samsung Electronics Co., Ltd., Suwon-si (KR)

(72) Inventors: Donghoon Kwon, Suwon-si (KR); Kihoon Jang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 352 days.

(21) Appl. No.: 18/466,289

(22) Filed: Sep. 13, 2023

(65) Prior Publication Data

US 2024/0113020 A1 Apr. 4, 2024

(30) Foreign Application Priority Data

Oct. 4, 2022 (KR) ........................ 10-2022-0126038

(51) Int. Cl.

| | |
|---|---|
| ***H10W 20/41*** | (2026.01) |
| ***H10B 43/10*** | (2023.01) |
| ***H10B 43/27*** | (2023.01) |
| ***H10B 43/35*** | (2023.01) |
| ***H10B 43/40*** | (2023.01) |

(Continued)

(52) U.S. Cl.

CPC .......... *H10W 20/435* (2026.01); *H10B 43/10* (2023.02); *H10B 43/27* (2023.02); *H10B 43/35* (2023.02); *H10B 43/40* (2023.02); *H10D 84/813* (2025.01); *H10W 20/42* (2026.01)

(58) Field of Classification Search

None

See application file for complete search history.

(56) References Cited

U.S. PATENT DOCUMENTS

| | | | |
|---|---|---|---|
| 9,070,434 | B2 | 6/2015 | Hioka et al. |
| 10,325,775 | B2 | 6/2019 | Sung et al. |
| 11,282,849 | B2 | 3/2022 | Oh |

(Continued)

FOREIGN PATENT DOCUMENTS

| | | | |
|---|---|---|---|
| KR | 10-2022-0103886 | A | 7/2022 |
| KR | 10-2022-0104459 | A | 7/2022 |

*Primary Examiner* — Jay C Chang

(74) *Attorney, Agent, or Firm* — Wolf, Greenfield & Sacks, P.C.

(57) ABSTRACT

A semiconductor device includes a first semiconductor structure including circuit elements on a first substrate, a lower interconnection structure connected to the circuit elements, and a peripheral region insulating layer covering the circuit elements; and a second semiconductor structure including a second substrate on the first substrate, a first stack structure including first and second gate electrodes spaced apart from each other and stacked on the second substrate, interlayer insulating layers alternately stacked with the first and second gate electrodes, first and second contact plugs passing through the first and second gate electrodes, and contact plug insulating layers alternately disposed with the interlayer insulating layers and surrounding the contact plugs. The second semiconductor structure includes a first capacitor structure including the first gate electrode, a contact plug insulating layer(s), and the second contact plug, or the second gate electrode, a contact plug insulating layer(s), and the first contact plug.

20 Claims, 26 Drawing Sheets

(51) Int. Cl.
*H10D 84/80* (2025.01)
*H10W 20/42* (2026.01)

(56) References Cited

U.S. PATENT DOCUMENTS

| | | | | |
|---|---|---|---|---|
| 11,282,851 | B2 | 3/2022 | Kwon et al. | |
| 11,302,627 | B1 | 4/2022 | Chen et al. | |
| 2004/0224474 | A1 | 11/2004 | Barth et al. | |
| 2016/0211363 | A1* | 7/2016 | Park | H10B 41/30 |
| 2016/0343725 | A1* | 11/2016 | Jung | H10B 43/50 |
| 2022/0068795 | A1 | 3/2022 | Xue et al. | |
| 2022/0149052 | A1 | 5/2022 | Kim | |

* cited by examiner

SEMICONDUCTOR DEVICE AND ELECTRONIC SYSTEM INCLUDING SEMICONDUCTOR DEVICE

CROSS-REFERENCE TO RELATED APPLICATION(S)

This application claims benefit of priority to Korean Patent Application No. 10-2022-0126038 filed on Oct. 4, 2022 in the Korean Intellectual Property Office, the disclosure of which is incorporated herein by reference in its entirety.

BACKGROUND

The present disclosure relates to a semiconductor device and an electronic system including the same.

In an electronic system requiring data storage, a semiconductor device capable of storing high-capacity data is required. Accordingly, a method of increasing data storage capacity of the semiconductor device has been researched. For example, as a method of increasing data storage capacity of a semiconductor device, a semiconductor device including memory cells arranged three-dimensionally, instead of memory cells arranged two-dimensionally, has been proposed.

SUMMARY

An aspect of the present disclosure provides a semiconductor device having improved electrical properties and an improved degree of integration.

Another aspect of the present disclosure provides an electronic system including a semiconductor device having improved electrical properties and an improved degree of integration.

According to an aspect of the present disclosure, there is provided a semiconductor device including a first semiconductor structure including a substrate, circuit elements on the substrate, a lower interconnection structure including a first lower interconnection structure and a second lower interconnection structure electrically connected to the circuit elements, the first lower interconnection structure and the second lower interconnection structure having different potentials, and a peripheral region insulating layer covering the circuit elements, and a second semiconductor structure including gate electrodes including a first gate electrode and a second gate electrode, spaced apart from each other and stacked on the second semiconductor structure in a first direction, the first gate electrode and the second gate electrode having different potentials, interlayer insulating layers alternately stacked with the gate electrodes, contact plugs including a first contact plug and a second contact plug passing through the gate electrodes and extending into the first semiconductor structure in the first direction, the first contact plug and the second contact plug having different potentials, and contact plug insulating layers alternately disposed with the interlayer insulating layers, the contact plug insulating layers surrounding the contact plugs. The second semiconductor structure may further include a first capacitor structure including the first gate electrode, at least one of the contact plug insulating layers, and the second contact plug, or the second gate electrode, at least one of the contact plug insulating layers, and the first contact plug, and a second capacitor structure including the first gate electrode, the interlayer insulating layer, and the second gate electrode. The first semiconductor structure may further include a third capacitor structure including the first lower interconnection structure, the peripheral region insulating layer, and the second lower interconnection structure.

According to another aspect of the present disclosure, there is provided a semiconductor device including a first semiconductor structure including circuit elements on a first substrate, a lower interconnection structure electrically connected to the circuit elements, and a peripheral region insulating layer covering the circuit elements, and a second semiconductor structure including a second substrate on the first substrate, a first stack structure including a first gate electrode and a second gate electrode spaced apart from each other and stacked on the second substrate in a first direction, the first gate electrode and the second gate electrode having different potentials, interlayer insulating layers alternately stacked with the first and second gate electrodes, contact plugs including a first contact plug and a second contact plug passing through the first and second gate electrodes, the first contact plug and the second contact plug having different potentials, and contact plug insulating layers alternately disposed with the interlayer insulating layers, the contact plug insulating layers surrounding the contact plugs. The second semiconductor structure may further include a first capacitor structure including the first gate electrode, at least one of the contact plug insulating layers, and the second contact plug, or the second gate electrode, at least one of the contact plug insulating layers, and the first contact plug.

According to another aspect of the present disclosure, there is provided an electronic system including a semiconductor device including a first semiconductor structure including circuit elements on a first substrate, a lower interconnection structure electrically connected to the circuit elements, and a peripheral region insulating layer covering the circuit elements; and a second semiconductor structure including a second substrate on the first substrate, a first stack structure including a first gate electrode and a second gate electrode spaced apart from each other and stacked on the second substrate in a first direction, the first gate electrode and the second gate electrode having different potentials, interlayer insulating layers alternately stacked with first and second gate electrodes, contact plugs including a first contact plug and a second contact plug passing through the first and second gate electrodes, the first contact plug and the second contact plug having different potentials, contact plug insulating layers alternately disposed with the interlayer insulating layers, the contact plug insulating layers surrounding the contact plugs, and an input/output pad electrically connected to the circuit elements, the second semiconductor structure further including a first capacitor structure including the first gate electrode, at least one of the contact plug insulating layers, and the second contact plug, or the second gate electrode, at least one of the contact plug insulating layers, and the first contact plug, and a controller electrically connected to the semiconductor device through the input/output pad, the controller controlling the semiconductor device.

According to example embodiments of the present disclosure, capacitor structures may include gate electrodes and contact structures, thereby providing a semiconductor device having improved electrical properties and reliability, and an electronic system including the same.

The various and beneficial advantages and effects of the present disclosure are not limited to the above description, and will be more easily understood in the course of describing specific example embodiments of the present disclosure.

BRIEF DESCRIPTION OF DRAWINGS

The above and other aspects, features, and advantages of the present inventive concept will be more clearly understood from the following detailed description, taken in conjunction with the accompanying drawings, wherein like reference numerals (when used) indicate corresponding elements throughout the several views, and in which.

DETAILED DESCRIPTION

Hereinafter, preferred example embodiments of the present disclosure will be described below with reference to the accompanying drawings.

Figure 1:
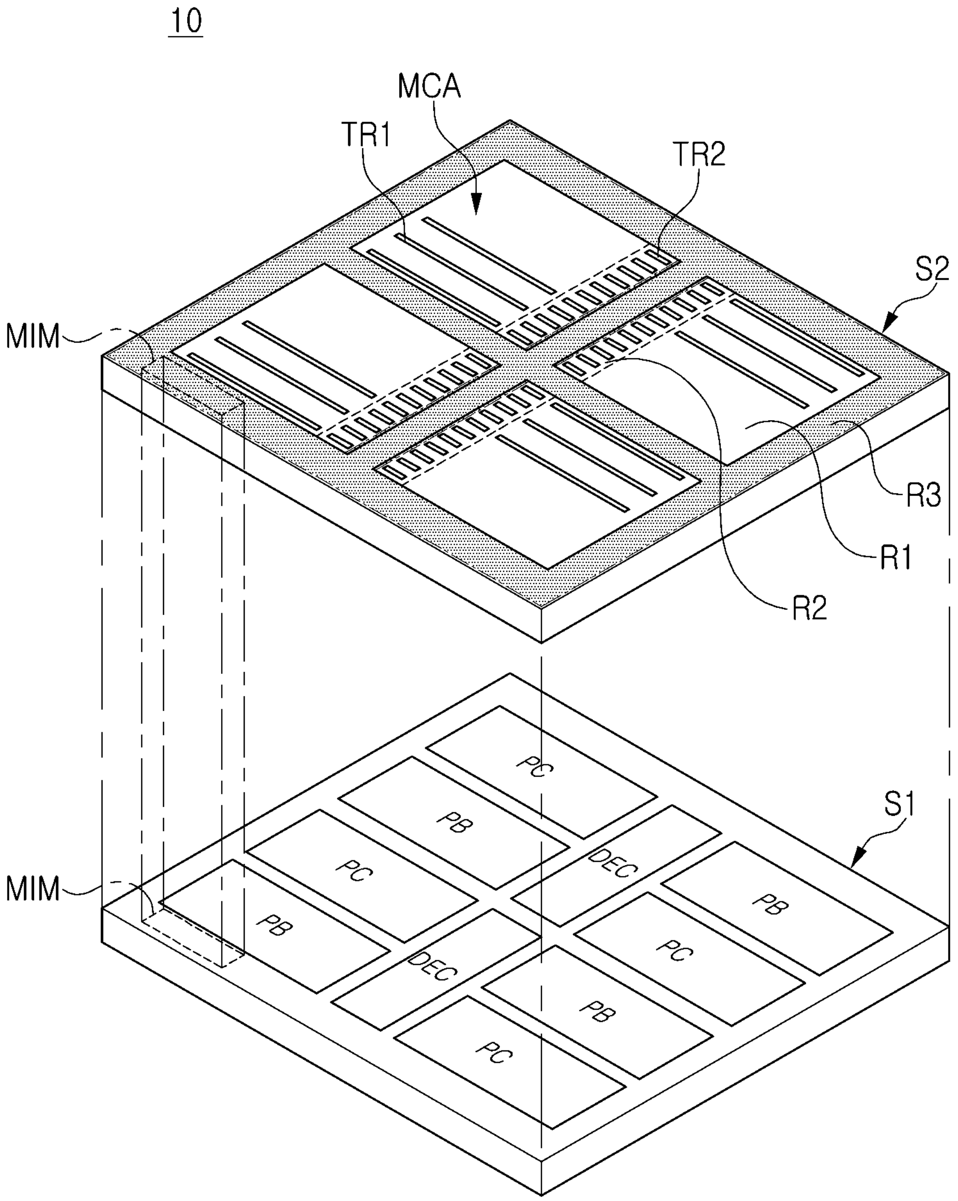
FIG. 1 is a schematic layout diagram illustrating a semiconductor device according to an example embodiment of the present disclosure.

FIG. 1 is a schematic layout diagram illustrating a semiconductor device according to an example embodiment of the present disclosure.

Referring to FIG. 1, a semiconductor device 10 may include first and second semiconductor structures S1 and S2 stacked in a vertical direction. The first semiconductor structure S1, a peripheral circuit structure, may include a row decoder DEC, a page buffer PB, and other peripheral circuits PC. The second semiconductor structure S2, a memory cell structure, may include memory cell arrays MCA and first and second through-interconnection regions TR1 and TR2. The first semiconductor structure S1 and the second semiconductor structure S2 may further include a capacitor region MIM, respectively. Although depicted in a peripheral region of the first semiconductor structure S1 and second semiconductor structure S2, it is to be appreciated that the capacitor region MIM may be disposed in other regions of the semiconductor device 10.

In the first semiconductor structure S1, the row decoder DEC may decode an address that is input to generate and transmit driving signals of a word line. The page buffer PB may be connected to the memory cell arrays MCA through bit lines to read information stored in the memory cells. The other peripheral circuits PC may be a region including a control logic and a voltage generator, and may include, for example, a latch circuit, a cache circuit, and/or a sense amplifier. The first region R1 may further include a pad region. In this case, the pad region may include an electrostatic discharge (ESD) element or a data input/output circuit.

In the first semiconductor structure S1, at least some of the various circuit regions DEC, PB, and PC may be disposed on a lower portion of the memory cell arrays MCA of the second semiconductor structure S2. For example, the page buffer PB and/or other peripheral circuits PC may be disposed on the lower portion of the memory cell arrays MCA to overlap the memory cell arrays MCA. However, in some example embodiments, circuits included in the first semiconductor structure S1 and arrangements thereof may be changed in various manners, and accordingly, circuits disposed to overlap the memory cell arrays MCA may also be changed in various manners.

In the first semiconductor structure S1, the capacitor region MIM may be a region in which capacitor structures for storing charge are disposed. In the first semiconductor structure S1, the capacitor region MIM may be disposed below a third region R3 of the second semiconductor structure S2. Capacitor structures on the first semiconductor structure S1 may be electrically connected to capacitor structures on the second semiconductor structure S2.

The second semiconductor structure S2 may have first to third regions R1, R2, and R3. The first and second regions R1 and R2 may be regions in which a substrate is disposed, such that the memory cell arrays MCA are positioned, and the third region R3 may be a region outside the substrate. The first region R1 may be a region in which memory cells are disposed, and the second region R2 may be a region for electrically connecting word lines to the circuit regions DEC, PB, and PC of the first semiconductor structure S1.

In the second semiconductor structure S2, the memory cell arrays MCA may be spaced apart from each other. It is illustrated that four memory cell arrays MCA are disposed. However, in some example embodiments, the number and arrangements of memory cell arrays MCA in the second semiconductor structure S2 may be changed in various manners.

The first and second through-interconnection regions TR1 and TR2 may be regions including an interconnection structure passing through the second semiconductor structure S2 to be connected to the first semiconductor structure S1. In the first region R1, the first through-interconnection regions TR1 may be disposed at regular intervals in the memory cell arrays MCA, and may include, for example, an interconnection structure electrically connected to the page buffer PB of the first semiconductor structure S1. In the second region R2, the second through-interconnection regions TR2 may be disposed in at least one-side edge region of the memory cell arrays MCA, and may include, for example, an interconnection structure such as a contact plug or the like, electrically connected to the row decoder DEC of the first semiconductor structure S1. The number of second through-interconnection regions TR2 may be greater than the number of the first through-interconnection regions TR1. However, in example embodiments, the shapes, number, and arrangements of the first and second through-interconnection regions TR1 and TR2 may be changed in various manners.

In the second semiconductor structure S2, the capacitor region MIM may be a region in which capacitor structures for storing charge are disposed. In the second semiconductor structure S2, the capacitor region MIM may be disposed in the third region R3 of the second semiconductor structure S2. Capacitor structures disposed on the second semiconductor structure S2 may be electrically connected to capacitor structures disposed on the first semiconductor structure S1.

Figure 2:
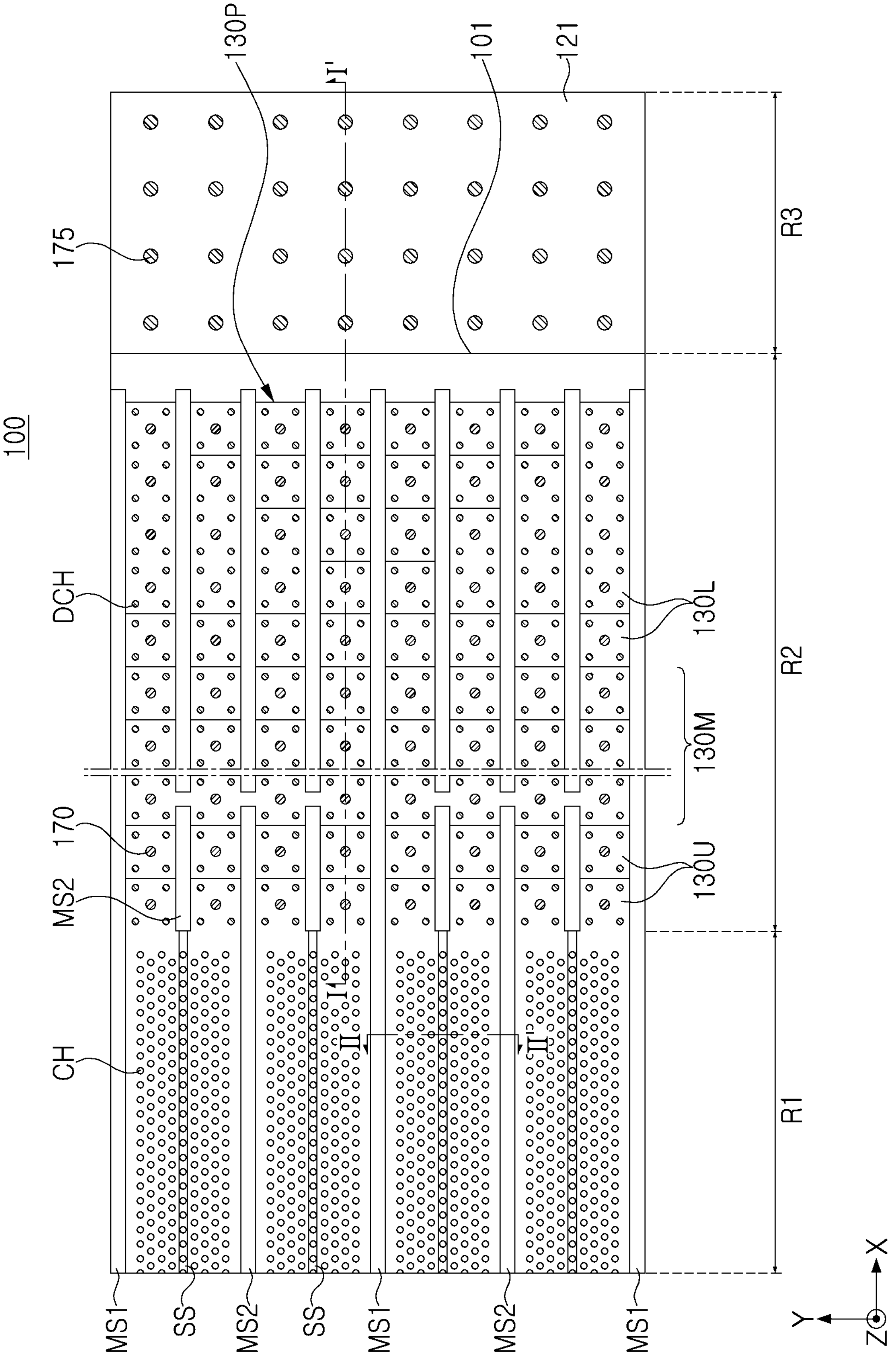
FIG. 2 is a schematic plan view of a semiconductor device according to an example embodiment of the present disclosure.

FIG. 2 is a schematic plan view of a semiconductor device according to an example embodiment of the present disclosure.

Figure 3:
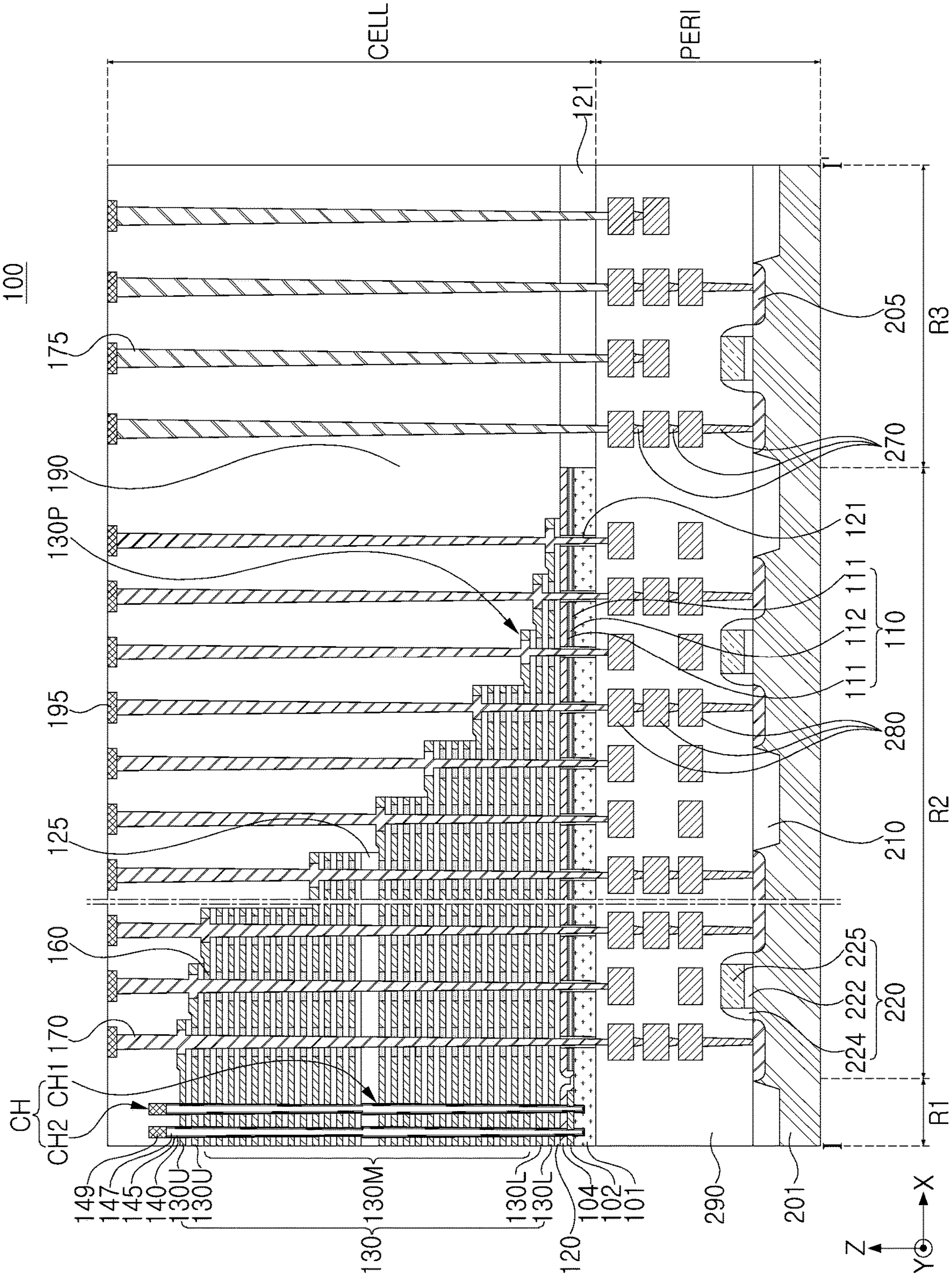
FIG. 3 is a schematic plan view of a semiconductor device according to an example embodiment of the present disclosure.
Figure 4:
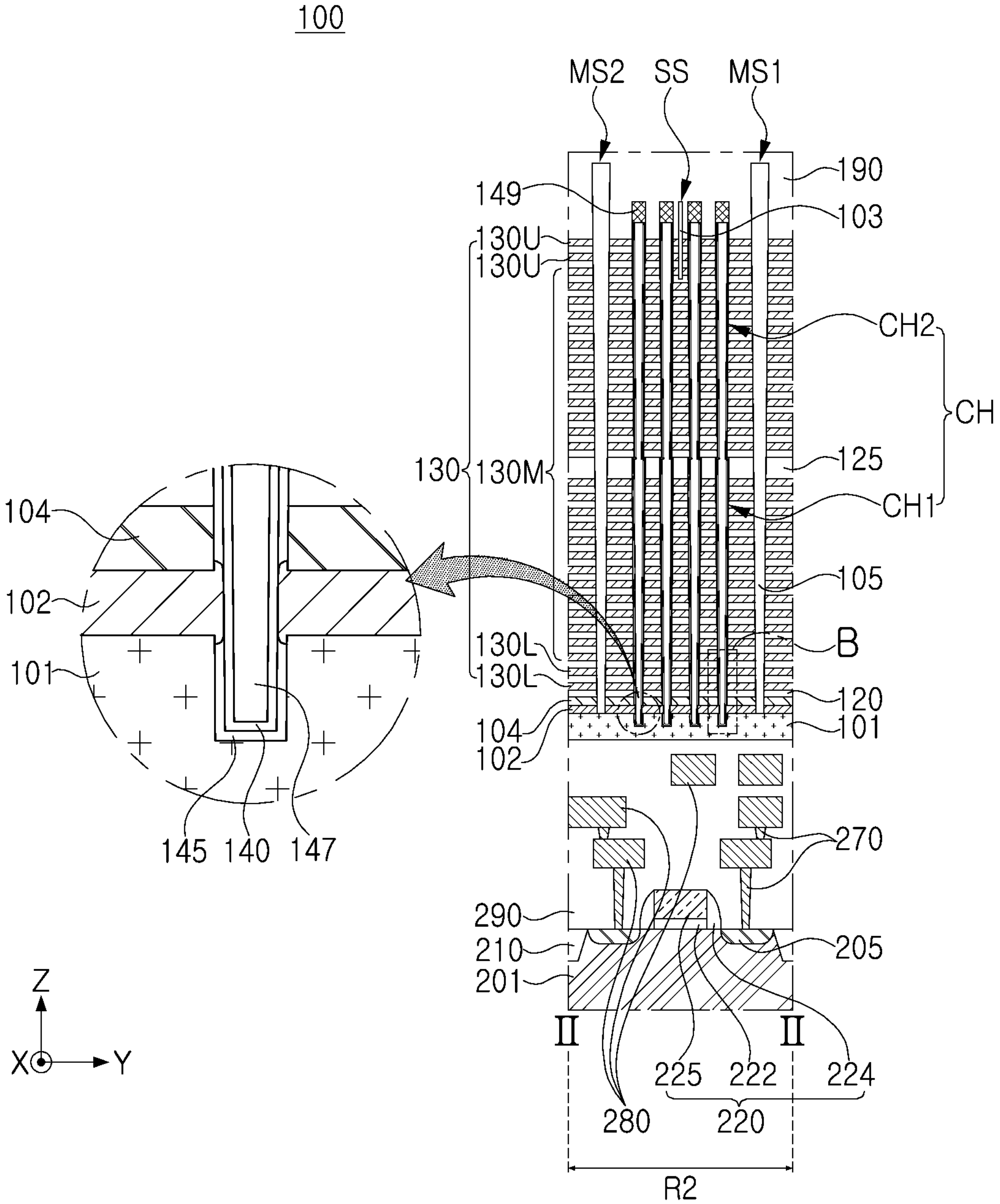
FIG. 4 is a schematic cross-sectional view of a semiconductor device according to according to an example embodiment of the present disclosure.

FIGS. 3 and 4 are schematic cross-sectional views of a semiconductor device according to an example embodiment of the present disclosure. FIG. 3 illustrates a cross-section taken along line I-I' of FIG. 2, and FIG. 4 illustrates a cross-section taken along line II-II' of FIG. 2.

Figure 5:
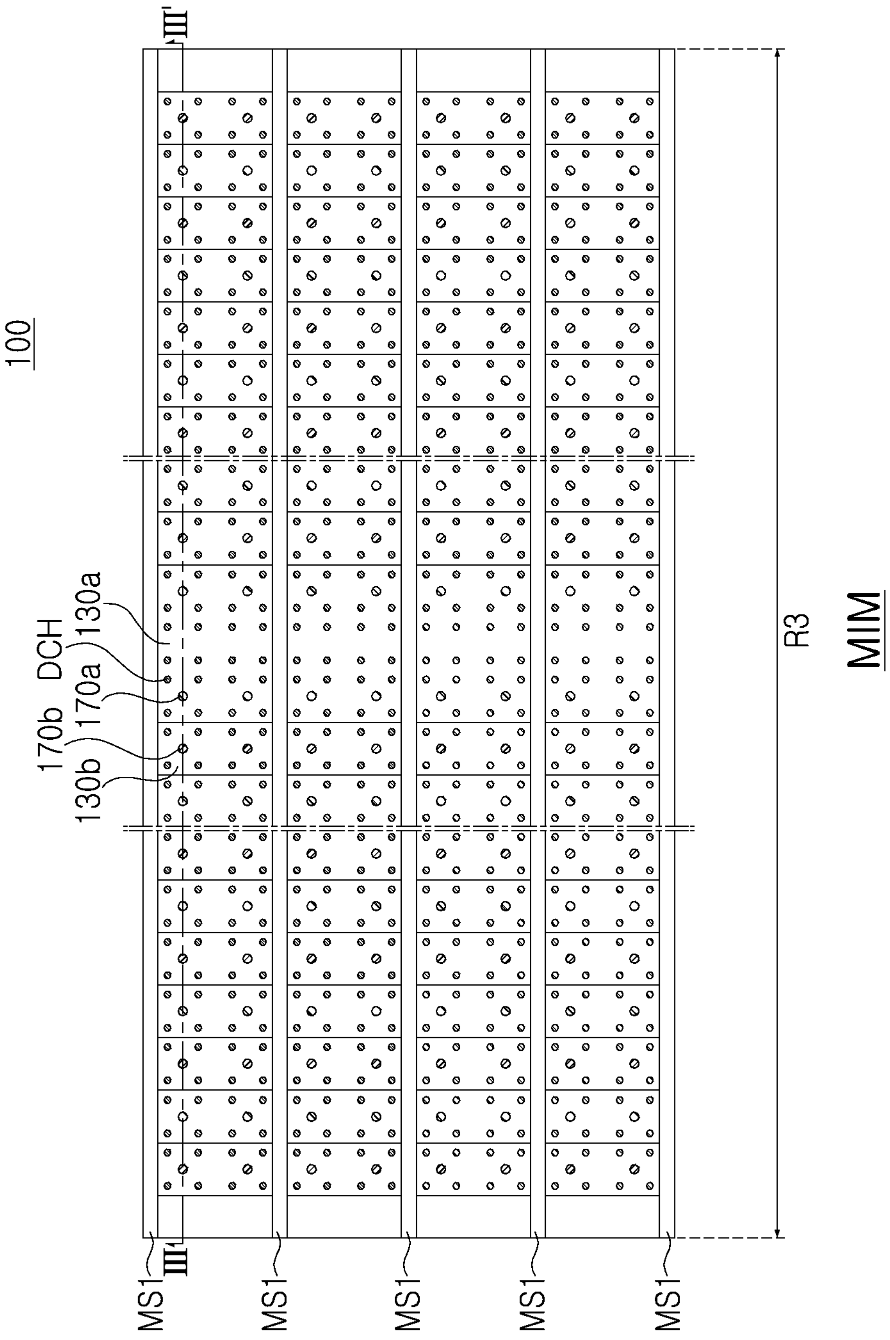
FIG. 5 is a schematic cross-sectional view of a semiconductor device according to according to an example embodiment of the present disclosure.

FIG. 5 is a schematic cross-sectional view of a semiconductor device according to according to an example embodiment of the present disclosure.

Figure 6:
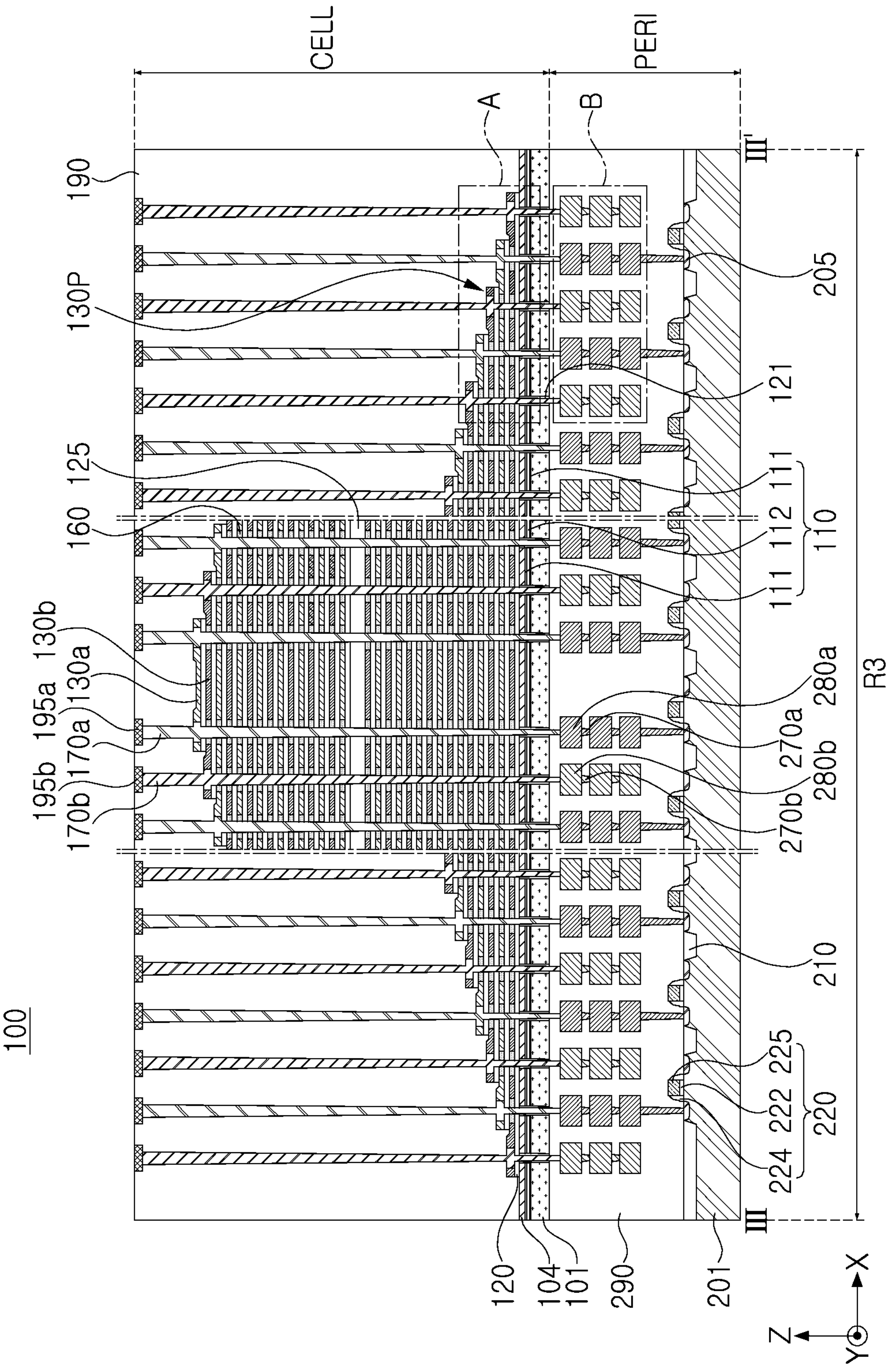
FIG. 6 is a schematic cross-sectional view of a semiconductor device according to an example embodiment of the present disclosure.

FIG. 6 is a schematic cross-sectional view of a semiconductor device according to an example embodiment of the present disclosure. FIG. 6 illustrates a cross-section taken along line III-III' of FIG. 5.

Figure 7:
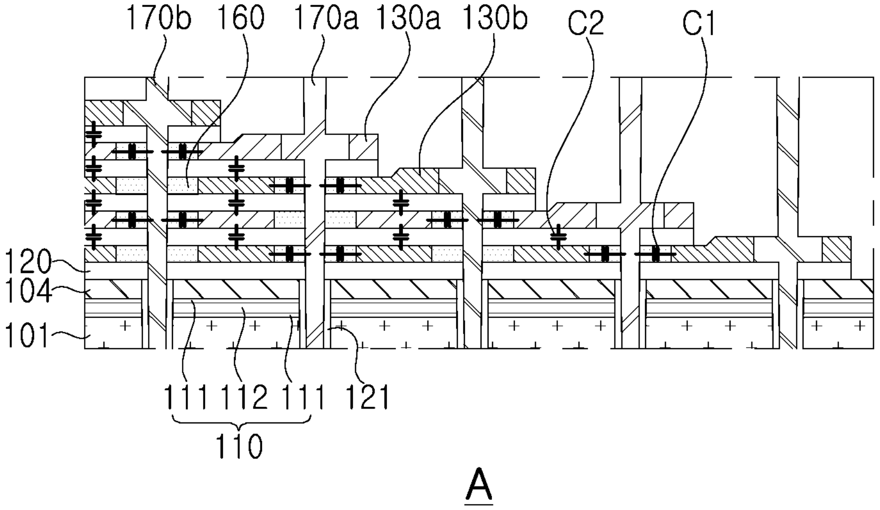
FIG. 7 is a partially enlarged view of a semiconductor device according to an example embodiment of the present disclosure.
Figure 8:
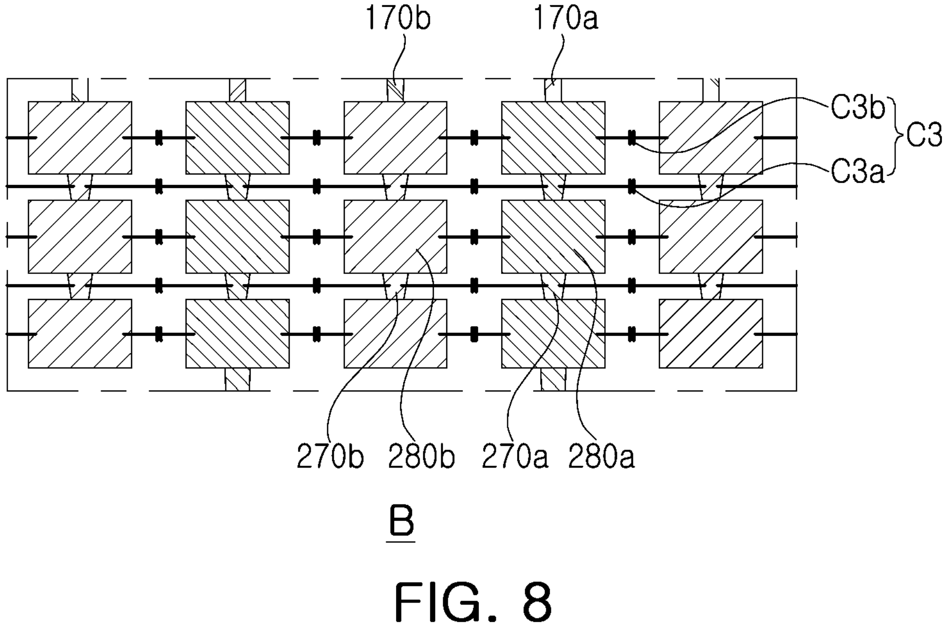
FIG. 8 is a partially enlarged view of a semiconductor device according to an example embodiment of the present disclosure.

FIGS. 7 and 8 are partially enlarged views of a semiconductor device according to an example embodiment of the present disclosure. FIG. 7 is an enlarged view of region “A” of FIG. 6, and FIG. 8 is an enlarged view of region “B” of FIG. 6.

First, referring to FIGS. 2 to 5, a semiconductor device 100 may include a peripheral circuit region PERI, a first semiconductor structure S1 including a first substrate 201, and a memory cell region CELL, a second semiconductor structure S2 including a second substrate 101. The memory cell region CELL may be disposed on the peripheral circuit region PERI. Conversely, in some example embodiments, the memory cell region CELL may be disposed below the peripheral circuit region PERI. The memory cell region CELL may form a portion of the first semiconductor structure S1 of FIG. 1, and the peripheral circuit region PERI may form a portion of the second semiconductor structure S2 of FIG. 1.

The peripheral circuit region PERI may include the first substrate 201, source/drain regions 205 and element isolation layers 210 in the first substrate 201, circuit elements 220 disposed on the first substrate 201, circuit contact plugs 270, circuit interconnection lines 280, and a peripheral region insulating layer 290.

The first substrate 201 may have an upper surface extending in an X-direction and a Y-direction. An active region may be defined on the first substrate 201 by element isolation layers 210. The source/drain regions 205 including impurities may be disposed in a portion of the active region. The first substrate 201 may include a semiconductor material, for example, a group IV semiconductor, a group III-V compound semiconductor, or a group II-VI compound semiconductor. The first substrate 201 may be provided as a bulk wafer or an epitaxial layer.

The circuit elements 220 may include a planar transistor. Each of the circuit elements 220 may include a circuit gate dielectric layer 222, a spacer layer 224, and a circuit gate electrode 225. On opposite sides of the circuit gate electrode 225, the source/drain regions 205 may be disposed in the first substrate 201.

On the first substrate 201, the peripheral region insulating layer 290 may be disposed on the circuit element 220. The circuit contact plugs 270 may pass through the peripheral insulating layer 290 to be connected to the source/drain regions 205. An electrical signal may be applied to the circuit element 220 by the circuit contact plugs 270. In a region not illustrated, the circuit contact plugs 270 may also be connected to the circuit gate electrode 225. The circuit interconnection lines 280 may be connected to the circuit contact plugs 270, and may be disposed in a plurality of layers.

The memory cell region CELL may include the second substrate 101 having the first region R1 and the second region R2, gate electrodes 130 stacked on the second substrate 101, interlayer insulating layers 120 alternately stacked with the gate electrodes 130, channel structures CH disposed to pass through a stack structure of the gate electrodes 130, first and second isolation regions MS1 and MS2 extending to pass through the stack structure of the gate electrodes 130, the contact plugs 170 extending in the second region R2 to pass through the gate electrodes 130, and contact plug insulating layers 160 surrounding the contact plugs 170, and through-plugs 175 disposed in a third region R3 outside the second substrate 101.

The memory cell region CELL may further include a first horizontal conductive layer 102 on the first region R1, a horizontal insulating layer 110 disposed on the second region R2 of the second substrate 101 to be parallel to the first horizontal conductive layer 102, a second horizontal conductive layer 104 on the first horizontal conductive layer 102 and the horizontal insulating layer 110, a substrate insulating layer 121 passing through second substrate 101, upper isolation regions SS passing through a portion of the stack structure of the gate electrodes 130, dummy channel structures DCH disposed in the second region R1 to pass through the stack structure of the gate electrodes 130, cell region insulating layer 190 and cell interconnection lines 195.

The first region R1 of the second substrate 101, a region in which the gate electrodes 130 are vertically stacked and the channel structures CH are disposed, may be a region in which memory cells are disposed, and the second region R2, a region in which the gate electrodes 130 extend to have different lengths, may be a region for electrically connecting the memory cells to the peripheral circuit region PERI. The second region R2 may be disposed in at least one end of the first region R1 in at least one direction, for example, an X-direction.

The second substrate 101 may have an upper surface extending in the X-direction and a Y-direction. The second substrate 101 may include a semiconductor material, for example, a group IV semiconductor, a group III-V compound semiconductor, or a group II-VI compound semiconductor. For example, the group IV semiconductor may include silicon, germanium, or silicon-germanium. The second substrate 101 may further include impurities. The second substrate 101 may be provided as a polycrystalline semiconductor layer such as a polycrystalline silicon layer or an epitaxial layer.

The first and second horizontal conductive layers 102 and 104 may be sequentially stacked and disposed on an upper surface of the first region R1 of the second substrate 101. The first horizontal conductive layer 102 may not extend into the second region R2 of the second substrate 101, and the second horizontal conductive layer 104 may extend into the second region R2.

The first horizontal conductive layer 102 may function as a portion of a common source line of the semiconductor device 100, and may function as, for example, a common source line together with the second substrate 101. As illustrated in the enlarged view of FIG. 4, the first horizontal conductive layer 102 may be directly connected to a channel layer 140 around the channel layer 140.

The second horizontal conductive layer 104 may be in contact with the second substrate 101 in some regions in which the first horizontal conductive layer 102 and the horizontal insulating layer 110 are not disposed. In the regions, the second horizontal conductive layer 104 may be bent while covering an end of the first horizontal conductive layer 102 or the horizontal insulating layer 110 to extend onto the second substrate 101.

The first and second horizontal conductive layers 102 and 104 may include a semiconductor material. For example, both the first and second horizontal conductive layers 102 and 104 may include polycrystalline silicon. In this case, at least the first horizontal conductive layer 102 may be a doped layer, and the second horizontal conductive layer 104 may be a doped layer or a layer including impurities diffused from the first horizontal conductive layer 102. However, in some example embodiments, the second horizontal conductive layer 104 may be replaced with an insulating layer.

In at least a portion of the second region R2, the horizontal insulating layer 110 may be disposed on the second substrate 101 to be parallel to the first horizontal conductive layer 102. The horizontal insulating layer 110 may include first and second horizontal insulating layers 111 and 112 alternately stacked on the second region R2 of the second substrate 101. The horizontal insulating layer 110 may be layers remaining after a portion of the horizontal insulating layer 110 is replaced with the first horizontal conductive layer 102 in a process of manufacturing the semiconductor device 100.

The horizontal insulating layer 110 may include silicon oxide, silicon nitride, silicon carbide, or silicon oxynitride. The first horizontal insulating layers 111 and the second horizontal insulating layer 112 may include different insulating materials. For example, the first horizontal insulating layers 111 may be formed of a material the same as that of the interlayer insulating layers 120, and the second horizontal insulating layer 112 may be formed of a material different from that of the interlayer insulating layers 120.

In the second region R2, the substrate insulating layer 121 may extend in a Z-direction and may be disposed to pass through the second substrate 101, the horizontal insulating layer 110, and the second horizontal conductive layer 104. The substrate insulating layer 121 may be disposed to surround each of the contact plugs 170. Accordingly, the contact plugs 170 connected to the different gate electrodes 130 may be electrically isolated from each other. The substrate insulating layer 121 may also be disposed in the third region R3, that is, outside of the second substrate 101. The substrate insulating layer 121 may include, for example, silicon oxide, silicon nitride, silicon carbide, or silicon oxynitride.

The gate electrodes 130 may be vertically spaced apart and stacked on the second substrate 101 to form a stack structure. The gate electrodes 130 may include lower gate electrodes 130L forming gates of ground selection transistors, memory gate electrodes 130M forming a plurality of memory cells, and upper gate electrodes 130U forming gates of string selection transistors. The number of memory gate electrodes 130M forming memory cells may be determined according to capacity of the semiconductor device 100. In some example embodiments, the number of upper and lower gate electrodes 130U and 130L may be one to four or more, and may have a structure the same as or different from that of the memory gate electrodes 130M. In some example embodiments, the gate electrodes 130 may further include a gate electrode 130 disposed on upper portions of upper gate electrodes 130U and/or lower portions of lower gate electrodes 130L, the gate electrode 130 forming an erase transistor used for an erase operation using a gate induced drain leakage (GIDL) phenomenon. In addition, some of the gate electrodes 130, for example, memory gate electrodes 130M adjacent to the upper gate electrodes 130U or lower gate electrodes 130L may be dummy gate electrodes.

The gate electrodes 130 are vertically spaced apart from each other and stacked on the first region R1, and may extend to have different lengths from the first region R1 to the second region R2 to form a staircase-shaped step structure. As illustrated in FIGS. 3 and 4, the gate electrodes 130 may form a step structure between the gate electrodes 130 in the X-direction, and may also be disposed to have a step structure in the Y-direction.

Due to the step structure, a lower gate electrode 130L may extend to be longer than an upper gate electrode 130U, and accordingly the gate electrodes 130 may respectively have regions exposed upwardly from the interlayer insulating layers 120, and the regions may be referred to as pad regions 130P. In each gate electrode 130, the pad region 130P may be a region including an end in the X-direction. In the second region R2 of the second substrate 101, the pad region 130P may correspond to a portion of the gate electrode 130 positioned on an uppermost portion of each of regions of the gate electrodes 130 forming the stack structure. In the pad regions 130P, the gate electrodes 130 may be connected to the contact plugs 170.

At least a subset of the gate electrodes 130 may have an increased thickness in the pad regions 130P. A thickness of each of at least the subset of the gate electrodes 130 may be increased in such a manner that a level of a lower surface thereof is constant and a level of an upper surface thereof is increased.

The gate electrodes 130 may be disposed to be isolated from each other in the Y-direction by a first isolation region MS1 extending in the X-direction. The gate electrodes 130 between a pair of first isolation regions MS1 may form one memory block, but a range of the memory block is not limited thereto. The gate electrodes 130 may include a metal material, for example, tungsten (W). In some example embodiments, the gate electrodes 130 may include polycrystalline silicon or a metal silicide material.

The interlayer insulating layers 120 may be disposed between the gate electrodes 130. In the same manner as the gate electrodes 130, the interlayer insulating layers 120 may be disposed to be spaced apart from each other in a direction, perpendicular to an upper surface of the second substrate 101, and to extend in the X-direction. The interlayer insulating layers 120 may include an insulating material such as silicon oxide or silicon nitride.

The first and second isolation regions MS1 and MS2 may be disposed to extend in the X-direction through the gate electrodes 130. The first and second isolation regions MS1 and MS2 may be disposed to be parallel to each other. The first and second isolation regions MS1 and MS2 may be connected to the second substrate 101 passing through all of the gate electrodes 130 stacked on the second substrate 101. The first isolation regions MS1 may extend as one in the X-direction, and the second isolation regions MS2 may intermittently extend between the pair of first isolation regions MS1 or may be disposed only in some regions. However, in some example embodiments, the arrangement sequence, number, and the like of the first and second isolation regions MS1 and MS2 are not limited to those illustrated in FIG. 2. As illustrated in FIG. 4, an isolation insulating layer 105 may be disposed in the first and second isolation regions MS1 and MS2.

As illustrated in FIG. 2, in the first region R1, the upper isolation regions SS may extend in the X-direction between the first isolation regions MS1 and the second isolation regions MS2. As illustrated in FIG. 4, for example, the upper isolation regions SS may isolate, from each other, a total of three gate electrodes 130 including the upper gate electrodes 130U in the Y-direction. However, in example embodiments, the number of gate electrodes 130 isolated by the upper isolation regions SS may be changed in various manners. The upper gate electrodes 130U isolated by the upper isolation regions SS may form different string selection lines. The upper isolation insulating layers 103 may be disposed in the upper isolation regions SS. The upper isolation insulating layer 103 may include an insulating material, for example, silicon oxide, silicon nitride, or silicon oxynitride.

As illustrated in FIG. 2, the channel structures CH may form one memory cell string, and may be spaced apart from each other while forming rows and columns on the first region R1. The channel structures CH may be disposed to form a lattice pattern or may be disposed in zigzag form in one direction. The channel structures CH may have a columnar shape and may have inclined side surfaces becoming narrower as a distance to the second substrate 101 decreases according to an aspect ratio.

As illustrated in FIG. 4, the channel structures CH may include first and second channel structures CH1 and CH2 vertically stacked. The channel structures CH may have a form in which the first channel structures CH1, passing through the lower stacked structure of the gate electrodes 130, and the second channel structures CH2, passing through the upper stacked structure of the gate electrodes 130, are connected to each other, and may have a bent portion caused by a width difference in a connection region. However, in some example embodiments, the number of channel structures stacked in the Z-direction may be changed in various manners.

As illustrated in the enlarged view of FIG. 4, the channel layer 140 may be disposed in the channel structures CH. In the channel structures CH, the channel layer 140 may be formed to have an annular shape surrounding an internal channel filling insulating layer 147. A lower portion of the channel layer 140 may be connected to the first horizontal conductive layer 102. The channel layer 140 may include a semiconductor material such as polycrystalline silicon or single crystal silicon.

A gate dielectric layer 145 may be disposed between the gate electrodes 130 and the channel layer 140. Although not specifically illustrated, the gate dielectric layer 145 may include a tunneling layer, a charge storage layer, and a blocking layer sequentially stacked from the channel layer 140. The tunneling layer may tunnel charge into the charge storage layer, and may include, for example, silicon oxide ($SiO_2$), silicon nitride ($Si_3N_4$), silicon oxynitride (SiON), or combinations thereof. The charge storage layer may be a charge trap layer or a floating gate conductive layer. The blocking layer may include silicon oxide ($SiO_2$), silicon nitride ($Si_3N_4$), silicon oxynitride (SiON), a high-K dielectric material, or combinations thereof. In some example embodiments, at least a portion of the gate dielectric layer 145 may extend in a horizontal direction along the gate electrodes 130. The channel pad 149 may be disposed only at an upper end of the upper second channel structure CH2. The channel pads 149 may include, for example, doped polycrystalline silicon.

The channel layer 140, the gate dielectric layer 145, and the channel filling insulating layer 147 may be connected to each other between the first channel structure CH1 and the second channel structure CH2. A relatively thick upper interlayer insulating layer 125 may be disposed between the first channel structure CH1 and the second channel structure CH2, that is, between the lower stack structure and the upper stack structure. However, in example embodiments, the forms of the interlayer insulating layers 120 and the upper interlayer insulating layer 125 may be changed in various manners.

The dummy channel structures DCH may be spaced apart from each other while forming rows and columns in the second region R2. In plan view, the dummy channel structures DCH may have a size larger than that of the channel structures CH, but the present disclosure is not limited thereto. The dummy channel structures DCH may be further disposed in a portion of the first region R1, adjacent to the second region R2. The dummy channel structures DCH may not be electrically connected to upper interconnection structures, and may not form a memory cell string in the semiconductor device 100, unlike the channel structures CH.

The dummy channel structures DCH may have a structure the same as or different from that of the channel structures CH. When the dummy channel structures DCH are formed together with the channel structures CH, the dummy channel structures DCH may have a structure the same as that of the channel structures CH. When the dummy channel structures DCH are formed using some of processes of forming the contact plugs 170, the dummy channel structures DCH may have a structure different from that of the channel structures CH. In this case, for example, the dummy channel structures DCH may have a structure of being filled with an insulating material such as oxide.

In the second region R2, the contact plugs 170 pass through the uppermost gate electrodes 130 and the contact plug insulating layers 160 therebelow, and may be connected to the pad regions 130P of the gate electrodes 130. The contact plugs 170 may pass through at least a portion of a cell region insulating layer 190, and may be disposed to be respectively connected to the pad regions 130P of the gate electrodes 130 exposed upwardly. The contact plugs 170 may pass through the second substrate 101, the second horizontal conductive layer 104, and the horizontal insulating layer 110 below the gate electrodes 130 to be connected to the circuit interconnection lines 280 in the peripheral circuit region PERI. The contact plugs 170 may be spaced apart from the second substrate 101, the second horizontal conductive layer 104, and the horizontal insulating layer 110 by the substrate insulating layer 121. The contact plugs 170 may be surrounded by the substrate insulating layer 121 to be electrically isolated from the second substrate 101.

The contact plugs 170 may include, for example, at least one of tungsten (W), copper (Cu), aluminum (Al), and alloys thereof. In some example embodiments, the contact plugs 170 may further include a barrier layer on sidewalls and bottom surfaces of contact holes in which the contact plugs 170 are disposed. The barrier layer may include, for example, at least one of titanium (Ti), titanium nitride (TiN), tantalum (Ta), and tantalum nitride (TaN).

The contact plug insulating layers 160 may be disposed to surround side surfaces of the contact plugs 170 below the pad regions 130P. Inner surfaces of the contact plug insulating layers 160 may surround the contact plugs 170, and outer surfaces of the contact plug insulating layers 160 may be surrounded by the gate electrodes 130. The contact plugs 170 may be physically and electrically connected to one gate electrode 130 by the contact plug insulating layers 160 and electrically isolated from the gate electrodes 130 therebelow by the contact plug insulating layers 160. The contact plug insulating layers 160 may include an insulating material, and may include, for example, at least one of silicon oxide, silicon nitride, and silicon oxynitride.

The through-plugs 175 may be disposed in the third region R3 of the memory cell region CELL, an outer region of the second substrate 101, and may extend to the peripheral circuit region PERI passing through the cell region insulating layer 190. The through-plugs 175 may be disposed to connect the cell interconnection lines 195 of the memory cell region CELL and the circuit interconnection lines 280 of the peripheral circuit region PERI. The through-plugs 175 may include a conductive material, for example, a metal material such as tungsten (W), copper (Cu), or aluminum (Al).

The cell region insulating layer 190 may be disposed to cover the second substrate 101, the gate electrodes 130 on the second substrate 101, and the peripheral region insulating layer 290. The cell region insulating layer 190 may be formed of an insulating material, or may be formed of a plurality of insulating layers.

The cell interconnection lines 195 may constitute an upper interconnection structure electrically connected to memory cells in the memory cell region CELL. The cell interconnection lines 195 may be connected to the contact plugs 170 and the through-plugs 175, and may be electrically connected to the gate electrodes 130 and the channel structures CH. In some example embodiments, the number of contact plugs and interconnection lines constituting the upper interconnection structure may be changed in various manners. The cell interconnection lines 195 may include metal, for example, tungsten (W), copper (Cu), aluminum (Al), or the like.

Subsequently, referring to FIGS. 6 to 8, the memory cell region CELL of the semiconductor device 100 may further include a first capacitor structure C1 and a second capacitor structure C2 disposed in a capacitor region MIM. The peripheral circuit region PERI of the semiconductor device 100 may further include a third capacitor structure C3 disposed in the capacitor region MIM. As described above with reference to FIG. 1, the capacitor region MIM may be a region spaced apart from the memory cell arrays MCA. Charge may be stored in the first to third capacitor structures C1, C2, and C3. In the present example embodiment, the first and second capacitor structures C1 and C2 may be stacked on the third capacitor structure C3 in the Z-direction, and thus an area on an X-Y plane may remain the same, while electric capacity of a capacitor structure capacity may be increased.

The first capacitor structure C1 may include a first gate electrode 130*a*, a contact plug insulating layer 160, and a second contact plug 170*b*, or a second gate electrode 130*b*, a contact plug insulating layer 160, and a first contact plug 170*a*. The second capacitor structure C2 may include the first gate electrode 130*a*, an interlayer insulating layer 120, and the second gate electrode 130*b*. The first and second gate electrodes 130*a* and 130*b* may not constitute a memory cell, and may form a stack structure to constitute a capacitor. The first and second gate electrodes 130*a* and 130*b* may be spaced apart from the gate electrodes 130 to be positioned on the same level, and may have substantially the same structure or a similar structure, a repeated description of the same structure is omitted below. The first and second contact plugs 170*a* and 170*b* may have a structure substantially the same as or similar to that of the contact plugs 170, a repeated description of the same structure is omitted below.

The first and second gate electrodes 130*a* and 130*b* and the first and second contact plugs 170*a* and 170*b* may include a conductive material, for example, a metal material such as tungsten (W), copper (Cu), aluminum (Al), or the like. The first gate electrode 130*a* and the first contact plug 170*a* may have a first potential (i.e., electric potential). A bias may be applied to the first gate electrode 130*a* through the first contact plug 170*a* in contact with the first gate electrode 130*a*. The first gate electrode 130*a* may be insulated from the first contact plug 170*a* not in contact with the first gate electrode 130*a* by the contact plug insulating layer 160. The second gate electrode 130*b* may be insulated from the first contact plug 170*a* by the contact plug insulating layer 160. The second gate electrode 130*b* and the second contact plug 170*b* may have a second potential different from the first potential. A bias may be applied to the second gate electrode 130*b* through the second contact plug 170*b* in contact with the second gate electrode 130*b*. The second gate electrode 130*b* may be insulated from the second contact plug 170*b* not in contact with the second gate electrode 130*b* by the contact plug insulating layer 160. The first gate electrode 130*a* may be insulated from the second contact plug 170*b* by the contact plug insulating layer 160. The interlayer insulating layer 120 and the contact plug insulating layer 160 may include an insulating material, for example, silicon oxide or silicon nitride. In the first capacitor structure C1, charge may be stored in the contact plug insulating layer 160 by a potential difference between the first gate electrode 130*a* having the first potential and the second contact plug 170*b* having the second potential. In addition, in the first capacitor structure C1, charge may be stored in the contact plug insulating layer 160 by a potential difference between the second gate electrode 130*b* having the second potential and the first contact plug 170*a* having the first potential. In the second capacitor structure C2, charge may be stored in the interlayer insulating layer 120 by a potential difference between the first gate electrode 130*a* having the first potential and the second gate electrode 130*b* having the second potential.

The third capacitor structure C3 may include a contact capacitor structure C3*a* including a first circuit contact plug 270*a*, a peripheral insulating layer 290, and a second circuit contact plug 270*b*, and an interconnection capacitor structure C3*b* including a first circuit interconnection line 280*a*, a peripheral insulating layer 290, and a second circuit interconnection line 280*b*. The first and second circuit contact plugs 270*a* and 270*b* may be positioned on a level the same as that of the circuit contact plugs 270, and may have substantially the same structure or a similar structure. Thus, the repeated description of the same structure is omitted below. The first and second circuit interconnection lines 280*a* and 280*b* may be positioned on a level the same as that of the circuit interconnection lines 280, and may have substantially the same structure or a similar structure. Thus, a repeated description of the same structure is omitted below.

The first and second circuit contact plugs 270*a* and 270*b* and the first and second circuit interconnection lines 280*a* and 280*b* may include a conductive material, for example, a metal material such as tungsten (W), copper (Cu), aluminum (Al), or the like. The first circuit contact plug 270*a* and the first circuit interconnection line 280*a* may have a first potential. A bias may be applied to the first circuit contact plug 270*a* and the first circuit interconnection line 280*a* through the first contact plug 170*a*. The first circuit interconnection line 280*a* may be connected to the source/drain regions 205 through the first circuit contact plug 270*a*. The second circuit contact plug 270*b* and the second circuit interconnection line 280*b* may have a second potential different from the first potential. A bias may be applied to the second circuit contact plug 270*b* and the second circuit interconnection line 280*b* through the second contact plug 170*b*. In a region not illustrated, the second circuit interconnection line 280*b* may be connected to the source/drain regions 205 through the second circuit contact plug 270*b*. The peripheral region insulating layer 290 may include an insulating material, for example, silicon oxide or silicon nitride. In the contact capacitor structure C3*a*, charge may be stored in the peripheral insulating layer 290 by a potential difference between the first circuit contact plug 270*a* having the first potential and the second circuit contact plug 270*b* having the second potential. In the interconnection capacitor structure C3*b*, charge may be stored in the peripheral region insulating layer 290 by a potential difference between the first circuit interconnection line 280*a* having the first potential and the second circuit interconnection line 280*b* having the second potential.

The first circuit interconnection line 280*a* may be connected to the source/drain regions 205 through the first circuit contact plug 270*a*.

The memory cell region CELL may further include the substrate insulating layer 121 disposed on the capacitor region MIM, first and second cell interconnection lines 195*a* and 195*b*, a dummy channel structure DCH, and a first isolation region MS1 (see FIG. 5). The substrate insulating layer 121 may include a first portion surrounding the first contact plug 170*a* and a second portion surrounding the second contact plug 170*b*, and the first portion and the second portion may be spaced apart from each other. The first contact plug 170*a* may be connected to the first contact plug 170*a* and to the first cell interconnection line 195*a* having the first potential. The second contact plug 170*b* may be connected to the second contact plug 170*b* and to the second cell interconnection line 195*b* having the second potential. In the capacitor region MIM, the dummy channel structure DCH may pass through the first and second gate electrodes 130*a* and 130*b*, may extend in the Z-direction, and may be regularly arranged around the first and second contact plugs 170*a* and 170*b*. In the capacitor region MIM, the first isolation region MS1 may extend in the X-direction between the first and second contact plugs 170*a* and 170*b*.

Figure 9:
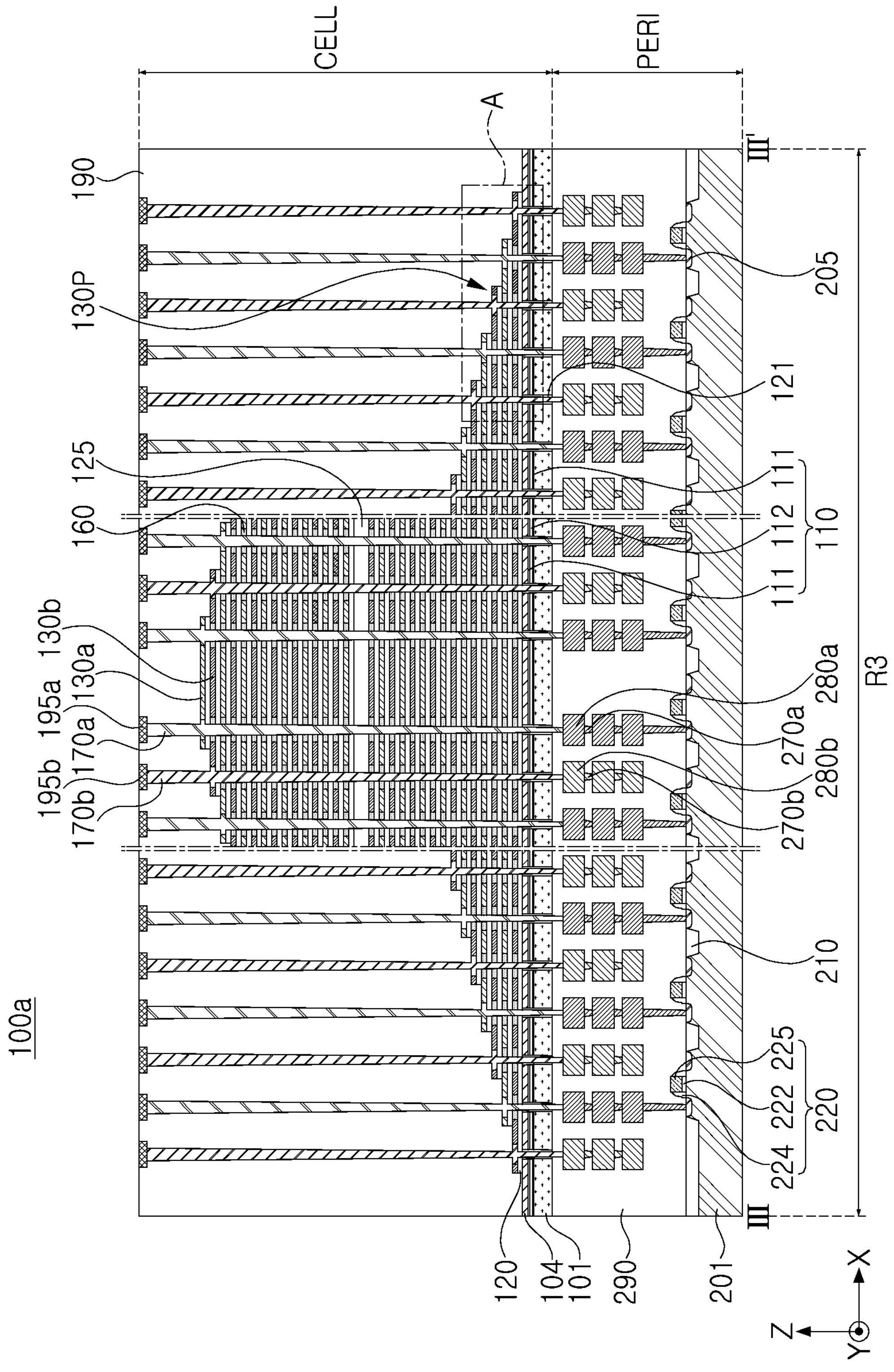
FIG. 9 is a schematic cross-sectional view of a semiconductor device according to an example embodiment of the present disclosure.

FIG. 9 is a schematic cross-sectional view of a semiconductor device according to an example embodiment. FIG. 9 illustrates a region corresponding to the region illustrated in FIG. 6.

Figure 10:
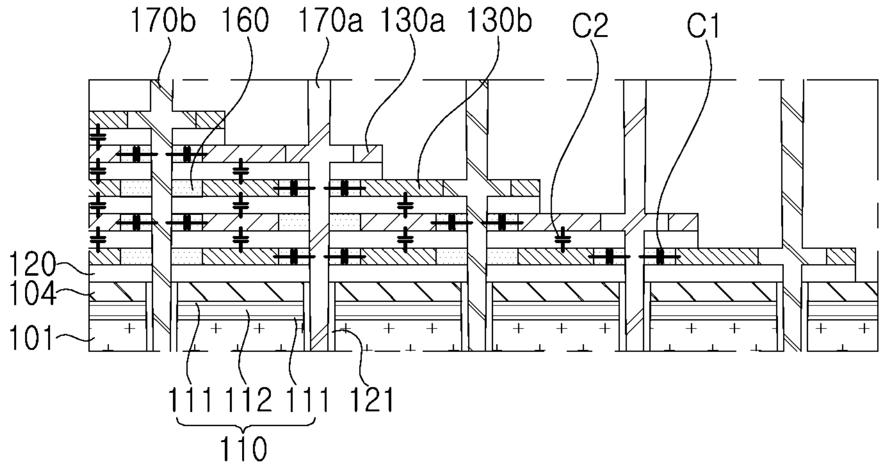
FIG. 10 is a partially enlarged view of a semiconductor device according to an example embodiment of the present disclosure.

FIG. 10 is a partially enlarged view of a semiconductor device according to an example embodiment. FIG. 10 is an enlarged view of region "A" of FIG. 9.

Referring to FIGS. 9 and 10, in a semiconductor device 100*a*, unlike the example embodiments of FIGS. 1 to 8, the first and second gate electrodes 130*a* and 130*b* may not have an increased thickness even in an end region, and may have a predetermined thickness. In the semiconductor device 100*a*, the gate electrodes 130 of the memory region corresponding to FIG. 3 may have a thickness in the pad regions 130P substantially the same as a thickness in a region other than the pad regions 130P.

Except for the above-described configuration, it can be understood that the semiconductor device 100*a* according to the present example embodiment has a structure similar to that of the semiconductor device 100 illustrated in FIGS. 1 to 8. In addition, components of the present example embodiment may be understood with reference to descriptions of the same or similar components of the semiconductor device 100 illustrated in FIGS. 1 to 8 unless otherwise described.

Figure 11:
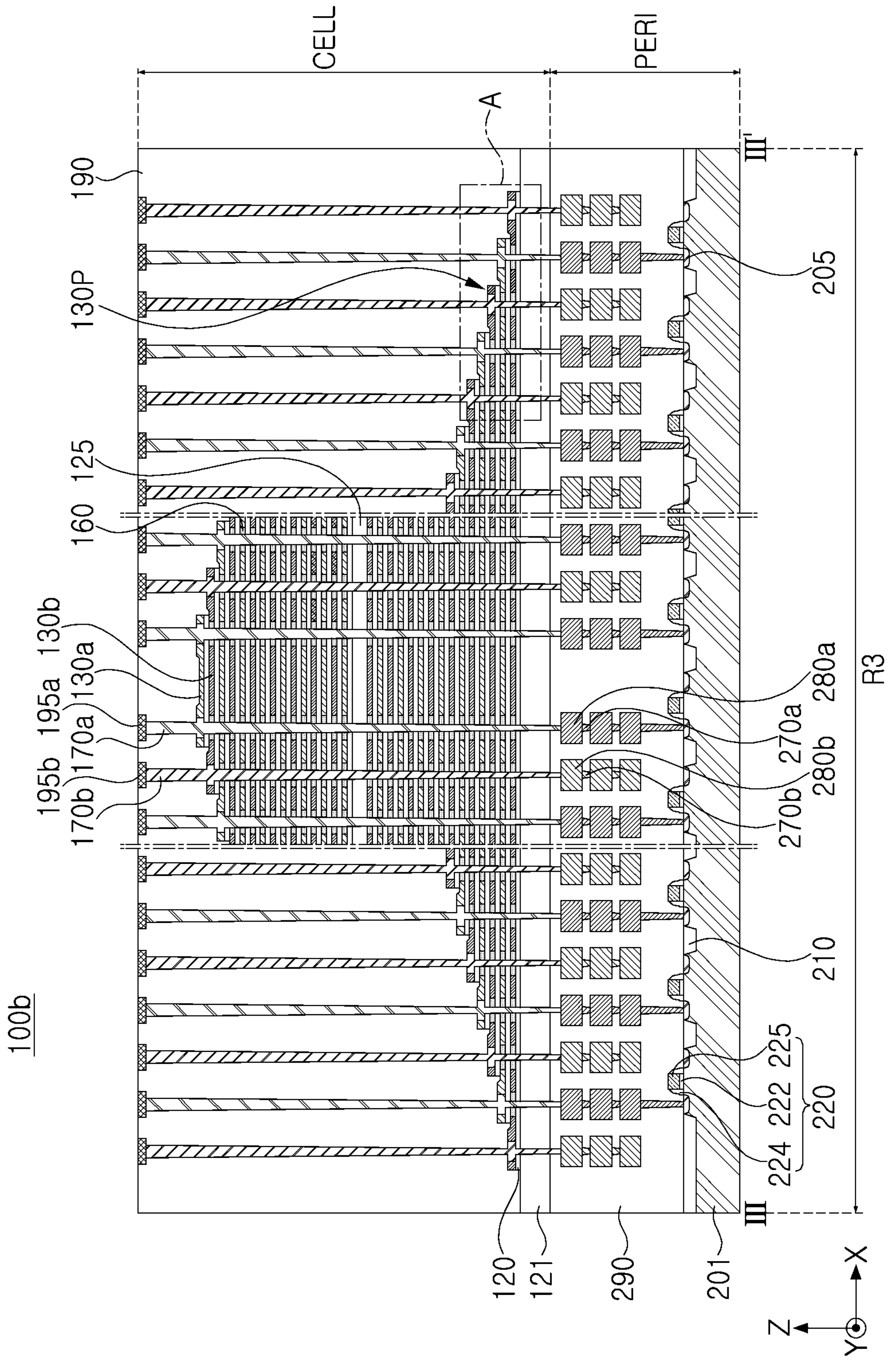
FIG. 11 is a schematic cross-sectional view of a semiconductor device according to an example embodiment of the present disclosure.

FIG. 11 is a schematic cross-sectional view of a semiconductor device according to an example embodiment of the present disclosure. FIG. 11 illustrates a region corresponding to the region illustrated in FIG. 6.

Figure 12:
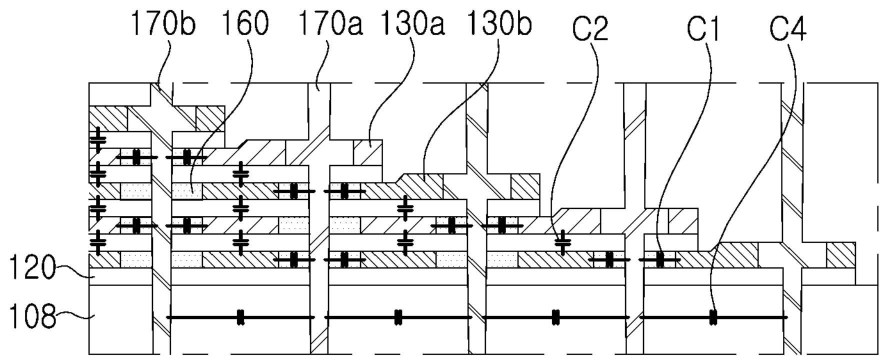
FIG. 12 is a partially enlarged view of a semiconductor device according to an example embodiment of the present disclosure.

FIG. 12 is a partially enlarged view of a semiconductor device according to an example embodiment. FIG. 12 is an enlarged view of region "A" of FIG. 11.

Referring to FIGS. 11 and 12, in a semiconductor device 100*b*, unlike the example embodiments of FIGS. 1 to 8, a second substrate 101 disposed in a capacitor region MIM, a second horizontal conductive layer 104, and a horizontal insulating layer 110 may be replaced with a substrate insulating layer 121. Accordingly, the substrate insulating layer 121 may include a first portion surrounding the first contact plug 170*a* and a second portion surrounding the second contact plug 170*b*, and the first portion and the second portion may be integrally connected to each other. The memory cell region CELL may further include a fourth capacitor structure C4 disposed in the capacitor region MIM. Charge may be stored in the fourth capacitor structure C4. In the fourth capacitor structure C4, charge may be stored in the substrate insulating layer 121 by a potential difference between the first contact plug 170*a* having the first potential and the second contact plug 170*b* having the second potential.

Except for the above-described configuration, it can be understood that the semiconductor device 100*b* according to the present example embodiment has a structure similar to that of the semiconductor device 100 illustrated in FIGS. 1 to 8. In addition, components of the present example embodiment may be understood with reference to descriptions of the same or similar components of the semiconductor device 100 illustrated in FIGS. 1 to 8, unless otherwise described.

Figure 13:
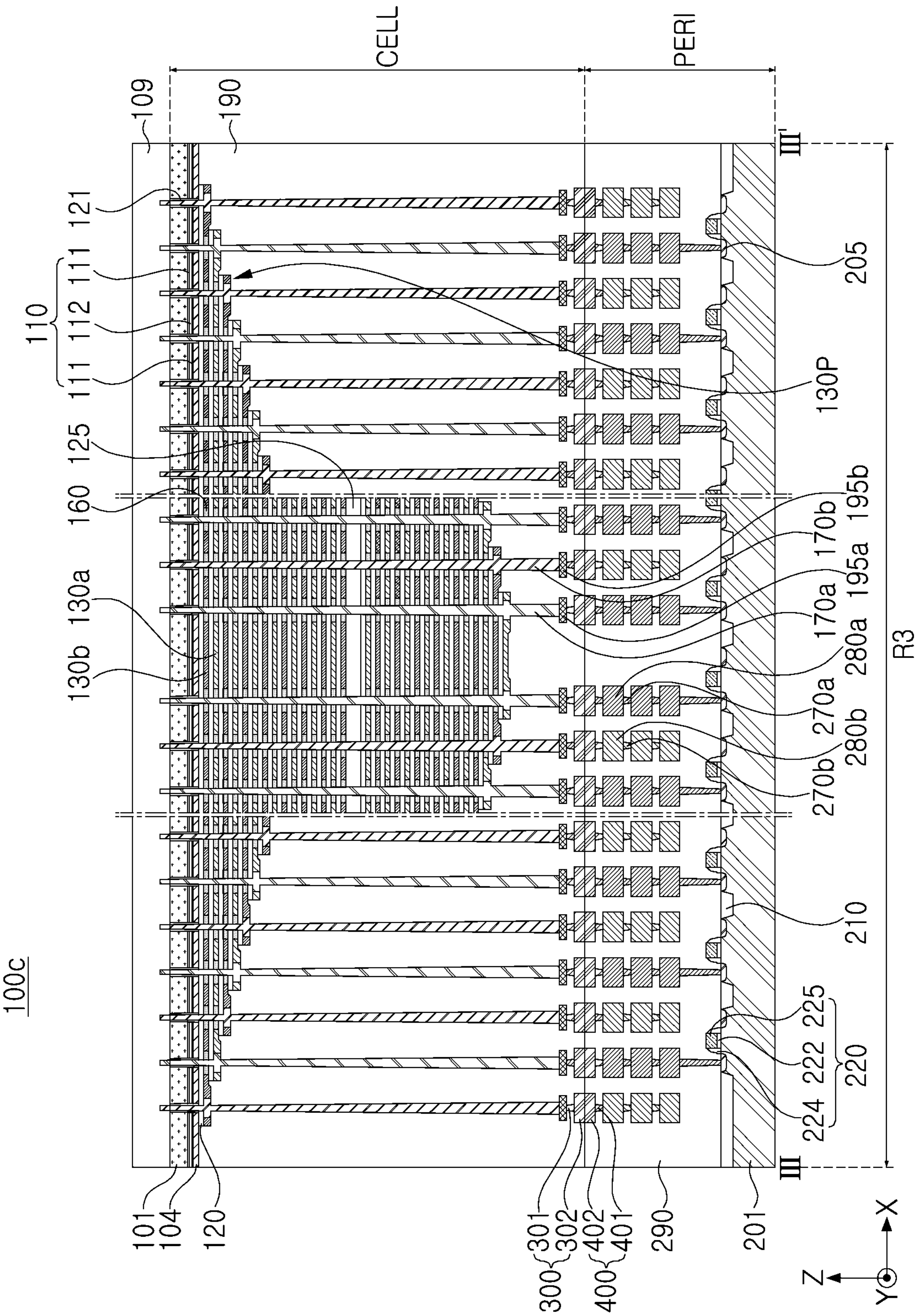
FIG. 13 is a schematic cross-sectional view of a semiconductor device according to an example embodiment of the present disclosure.

FIG. 13 is a schematic cross-sectional view of a semiconductor device according to an example embodiment of the present disclosure. FIG. 13 illustrates a region corresponding to the region illustrated in FIG. 6.

Referring to FIG. 13, unlike the example embodiments of FIGS. 1 to 8, a semiconductor device 100*c* may have a structure in which a peripheral circuit region PERI and a memory cell region CELL are vertically bonded to each other. To this end, the peripheral circuit region PERI may further include a first bonding structure 400, and the memory cell region CELL may further include a second bonding structure 300 and a passivation layer 109 on a second substrate 101. The first bonding structure 400 may include first bonding vias 401 and first bonding metal layers 402, and the second bonding structure 300 may include second bonding vias 301 and second bonding metal layers 302.

The first bonding metal layers 402 and the second bonding metal layers 302 may include a conductive material such as copper (Cu). The first bonding metal layers 402 may be electrically connected to the circuit interconnection lines 280 through the first bonding vias 401. The second bonding metal layers 302 may be electrically connected to first and second cell interconnection lines 195*a* and 195*b* through the second bonding vias 301. In some example embodiments, the peripheral region insulating layer 290 and the cell region insulating layer 190 may surround the first bonding metal layers 402 and the second bonding metal layers 302, respectively, and may further include a bonding dielectric layer disposed to have a predetermined depth from an upper surface thereof. The bonding dielectric layer may include, for example, at least one of SiO, SiN, SiCN, SiOC, SiON, and SiOCN. The passivation layer 109 may be disposed on the second substrate 101 to protect the second substrate 101, and may include an insulating material.

Upper ends of the first and second contact plugs 170*a* and 170*b* may extend into the passivation layer 109 through the second substrate 101. In some example embodiments, the upper ends of the first and second contact plugs 170*a* and 170*b* may be positioned in the second substrate 101.

The peripheral circuit region PERI and the memory cell region CELL may be bonded to each other by bonding between the first bonding metal layers 402 and the second bonding metal layers 302 and bonding between the bonding dielectric layers. Bonding between the first bonding metal layers 402 and the second bonding metal layers 302 may be, for example, copper (Cu)-copper (Cu) bonding, and bonding between the bonding dielectric layers may be, for example, dielectric-dielectric bonding such as SiCN—SiCN bonding. The peripheral circuit region PERI and the memory cell region CELL may be bonded to each other by hybrid bonding including copper (Cu)-copper (Cu) bonding and dielectric-dielectric bonding.

Except for the above-described configuration, it can be understood that the semiconductor device 100*c* according to the present example embodiment has a structure similar to that of the semiconductor device 100 illustrated in FIGS. 1 to 8. In addition, components of the present example embodiment may be understood with reference to descriptions of the same or similar components of the semiconductor device 100 illustrated in FIGS. 1 to 8, unless otherwise described.

FIGS. 14A to 14K are schematic cross-sectional views illustrating a method of manufacturing a semiconductor device according to an example embodiment of the present disclosure. FIGS. 14A to 14K illustrate regions corresponding to the region illustrated in FIG. 6.

Figure 14A:
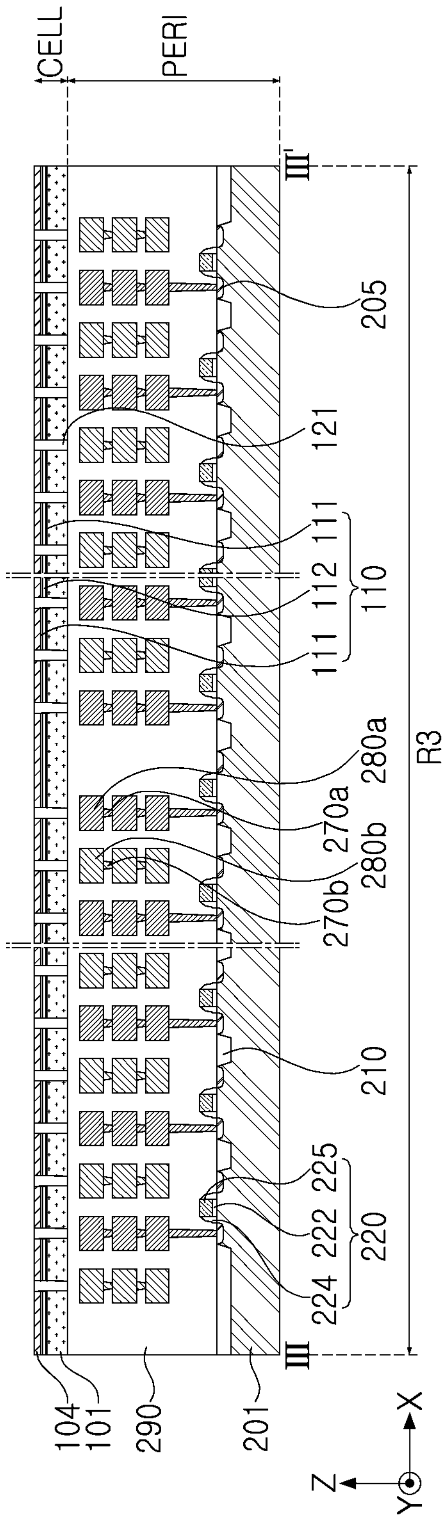
FIGS. 14A to 14K are schematic cross-sectional views illustrating a method of manufacturing a semiconductor device according to an example embodiment of the present disclosure.

Referring to FIG. 14A, a peripheral circuit region PERI including circuit elements 220 and lower interconnection structures may be formed on a first substrate 201, and a second substrate 101 in which a memory cell region CELL is provided, a horizontal insulating layer 110, a second horizontal conductive layer 104, and a substrate insulating layer 121 may be formed on an upper portion of the peripheral circuit region PERI.

First, element isolation layers 210 may be formed in the first substrate 201, and then a circuit gate dielectric layer 222 and a circuit gate electrode 225 may be sequentially formed on the first substrate 201. The element isolation layers 210 may be formed by, for example, a shallow trench isolation (STI) process, although other isolation techniques may alternatively be utilized (e.g., local oxidation of silicon (LOCOS)). The circuit gate dielectric layer 222 and the circuit gate electrode 225 may be formed, for example, using atomic layer deposition (ALD) or chemical vapor deposition (CVD). The circuit gate dielectric layer 222 may be formed of silicon oxide, and the circuit gate electrode 225 may be formed of at least one of polycrystalline silicon or a metal silicide layer, but the present disclosure is not limited thereto. Subsequently, a spacer layer 224 and source/drain regions 205 may be formed on opposite sidewalls of the circuit gate dielectric layer 222 and the circuit gate electrode 225. In some example embodiments, the spacer layer 224 may include a plurality of layers. Subsequently, the source/drain regions 205 may be formed by performing an ion implantation process.

Among the lower interconnection structures, circuit contact plugs 270 may be formed by forming a portion of a peripheral region insulating layer 290, etching and removing the portion, and filling a conductive material. The circuit interconnection lines 280 may be formed by, for example, depositing the conductive material, and then patterning the conductive material.

The peripheral region insulating layer 290 may include a plurality of insulating layers. The peripheral region insulating layer 290 may be partially formed in respective operations of forming the lower interconnection structures, and may be partially formed on an upper portion of an uppermost circuit interconnection line 280, and thus may be finally formed to cover the circuit elements 220 and the lower interconnection structures.

Subsequently, the second substrate 101 may be formed on the peripheral insulating layer 290. The second substrate 101 may be formed of, for example, polycrystalline silicon and may be formed by a CVD process. Polycrystalline silicon forming the second substrate 101 may include impurities.

First and second horizontal insulating layers 111 and 112 forming the horizontal insulating layer 110 may be alternately stacked on the second substrate 101. A portion of the horizontal insulating layer 110 may be replaced with the first horizontal conductive layer 102 of FIG. 6 through a subsequent process. The first horizontal insulating layers 111 may include a material different from that of the second horizontal insulating layer 112. For example, the first horizontal insulating layers 111 may be formed of a material the same as that of interlayer insulating layers 120, and the second horizontal insulating layer 112 may be formed of a material the same as that of subsequent sacrificial insulating layers 118. The second horizontal conductive layer 104 may be formed on the horizontal insulating layer 110.

The substrate insulating layer 121 may be formed to pass through the second substrate 101 in regions in which the contact plugs 170 are to be disposed. The substrate insulating layer 121 may be formed by removing portions of the second substrate 101, the horizontal insulating layer 110, and the second horizontal conductive layer 104, and then filling the removed portions with an insulating material. After the insulating material is filled, a planarization process may be further performed using a chemical mechanical polishing (CMP) process. Accordingly, an upper surface of the substrate insulating layer 121 and an upper surface of the second horizontal conductive layer 104 may be substantially coplanar with each other.

Figure 14B:
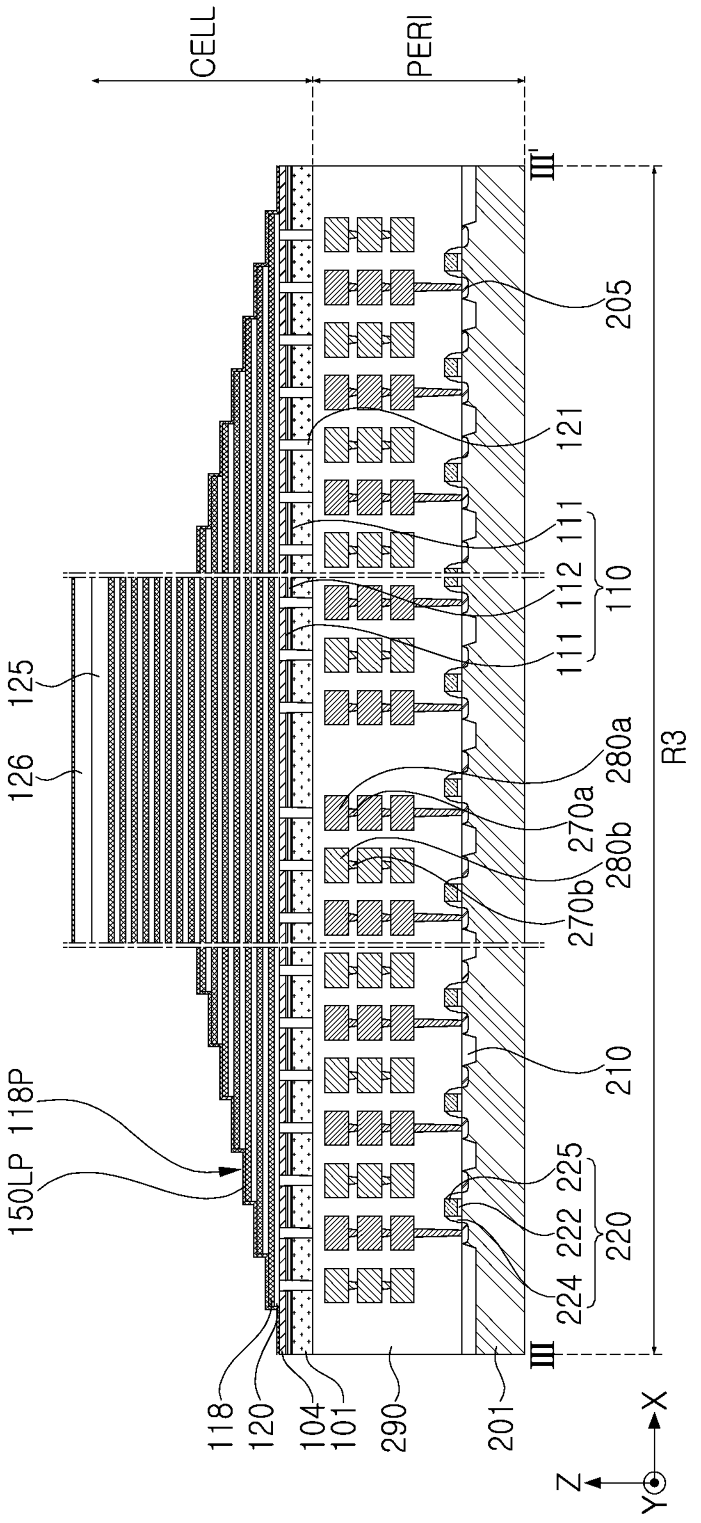

Referring to FIG. 14B, sacrificial insulating layers 118 and interlayer insulating layers 120 forming a lower stack structure may be alternately stacked on the second horizontal conductive layer 104, and a step structure may be formed, and then a first preliminary nitride layer 150LP may be formed.

In the present operation, the sacrificial insulating layers 118 and the interlayer insulating layers 120 may be formed. A relatively thick upper interlayer insulating layer 125 may be formed on an uppermost portion thereof, and an etch stop layer 126 may be formed thereon. The sacrificial insulating layers 118 may be replaced with gate electrodes 130 (see FIG. 6) through a subsequent process. The sacrificial insulating layers 118 may be formed of a material different from that of the interlayer insulating layers 120, and may be formed of an etchable material having etch selectivity for the interlayer insulating layers 120 under a specific etching condition. For example, the interlayer insulating layer 120 and the upper interlayer insulating layer 125 may be formed of at least one of silicon oxide and silicon nitride, and the sacrificial insulating layers 118 may be formed of a material, different from that of the interlayer insulating layer 120, selected from oxide, silicon carbide, and silicon nitride. In some example embodiments, the interlayer insulating layers 120 may not all have the same thickness. In addition, the thickness of the interlayer insulating layers 120 and the sacrificial insulating layers 118 and the number of films constituting the interlayer insulating layers 120 and the sacrificial insulating layers 118 may be changed from those illustrated in various manners. The etch stop layer 126 may be a layer for protecting a lower structure when a step structure is formed, and may also be referred to as a hard mask layer.

Subsequently, a photolithography process and an etching process for the sacrificial insulating layers 118 may be repeatedly performed using a mask layer, such that the upper sacrificial insulating layers 118 may extend to be shorter than the lower sacrificial insulating layers 118. Accordingly, the sacrificial insulating layers 118 may form a staircase-shaped step structure in a predetermined unit, and sacrificial pad regions 118P positioned on uppermost portions of the sacrificial insulating layers 118 may be upwardly exposed.

Subsequently, a first preliminary nitride layer 150LP may be formed on the lower stack structure. The first preliminary nitride layer 150LP may cover the exposed sacrificial pad regions 118P along a staircase shape of the lower stack structure, may cover side surfaces of the lower stack structure, and may extend onto a lowermost interlayer insulating layer 120. The thickness of the first preliminary nitride layer 150LP may range from about 50% to about 110% of the thickness of the sacrificial insulating layers 118, but the present disclosure is not limited thereto.

Figure 14C:
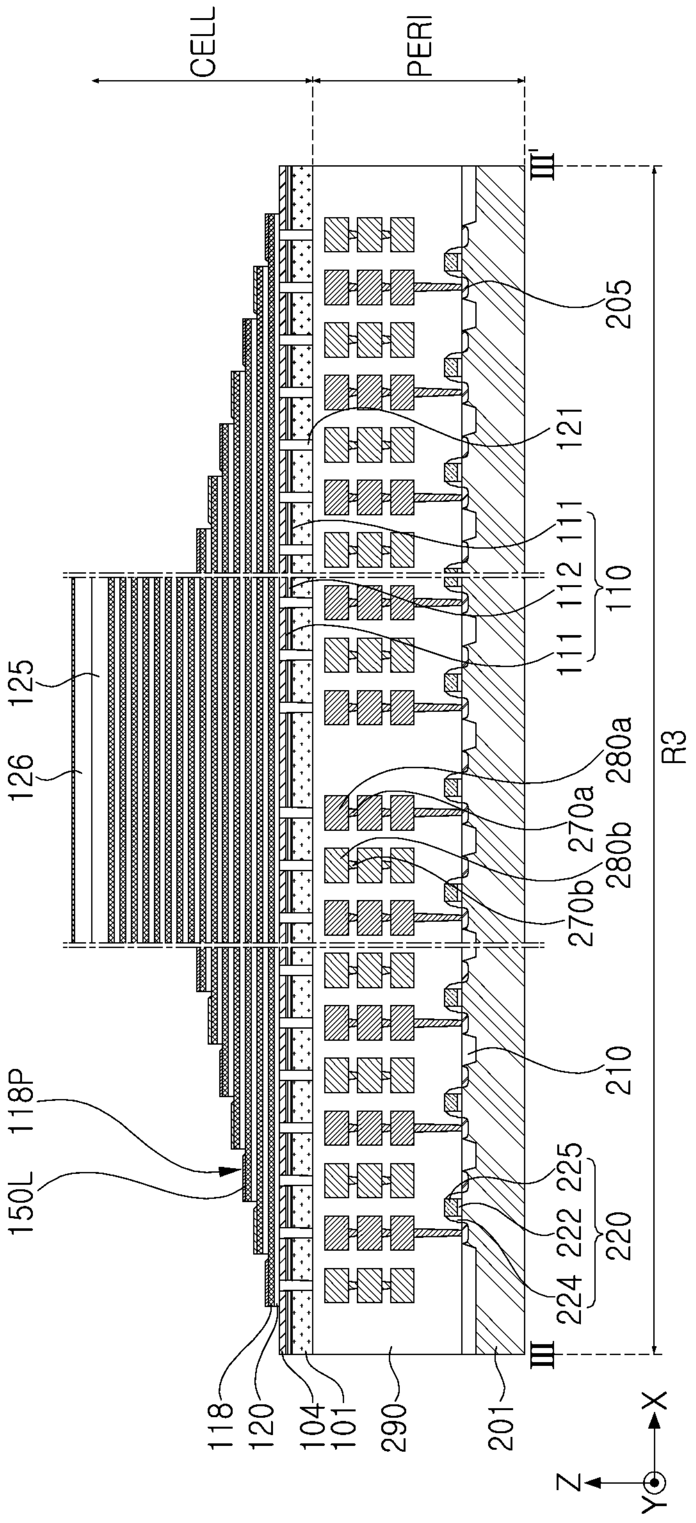

Referring to FIG. 14C, the first nitride layer 150L may be formed by partially removing the first preliminary nitride layer 150LP to remain only on the sacrificial pad regions 118P.

The first preliminary nitride layer 150LP may be selectively removed from side surfaces of a staircase of the lower stack structure. The removal process may be performed after, for example, physical properties of horizontally deposited regions of the first preliminary nitride layer 150LP are changed using plasma. Accordingly, the first preliminary nitride layer 150LP may remain on the sacrificial pad regions 118P to form a first nitride layer 150L.

Figure 14D:
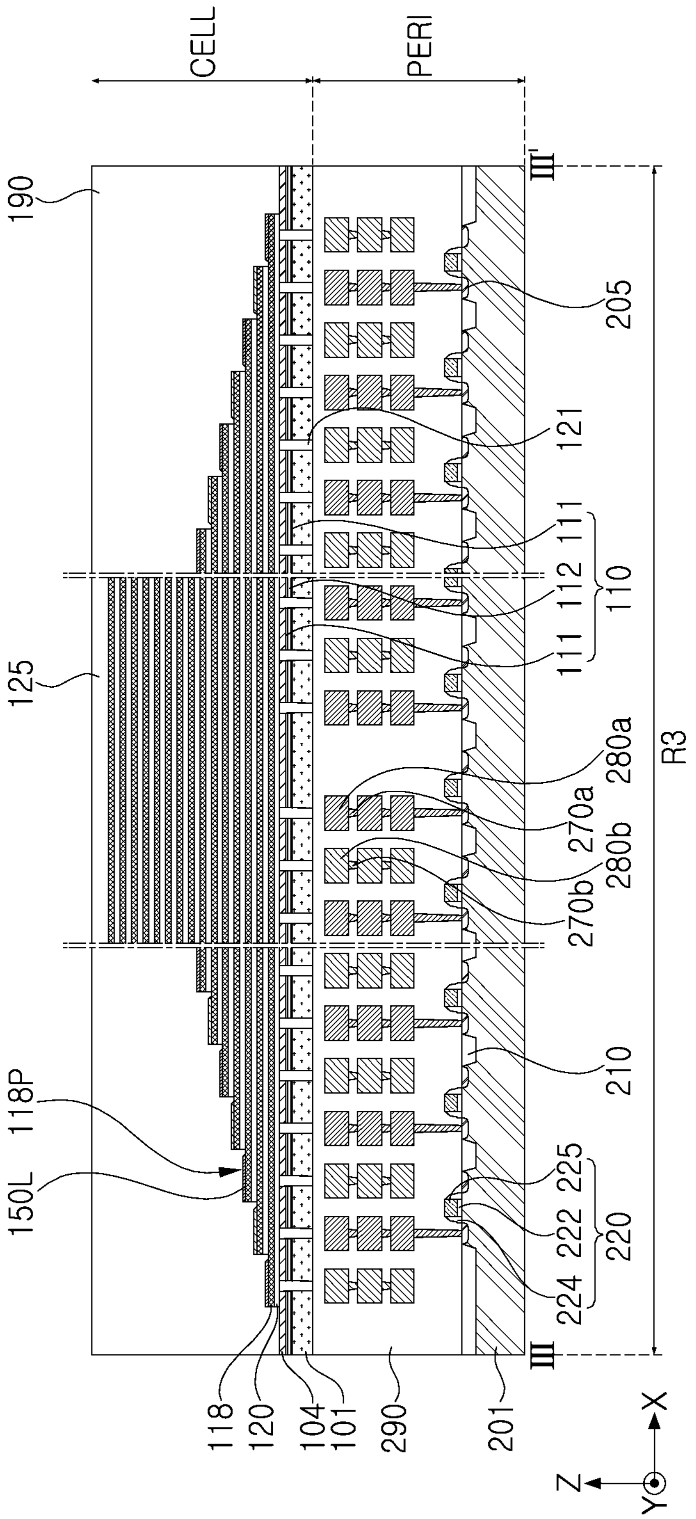

Referring to FIG. 14D, first channel sacrificial layers (not illustrated), passing through the lower stack structure, may be formed.

First, a portion of a cell region insulating layer 190, covering the lower stack structure of the sacrificial insulating layers 118 and the interlayer insulating layers 120, may be formed, and the etch stop layer 126 may be removed by a planarization process.

Subsequently, the first channel sacrificial layers may be formed in a region corresponding to first channel structures CH1 (see FIG. 3). The first channel sacrificial layers may be formed by forming lower channel holes to pass through the lower stack structure, and then depositing a material forming the first channel sacrificial layers in the lower channel holes. The first channel sacrificial layers may include, for example, polycrystalline silicon.

Figure 14E:
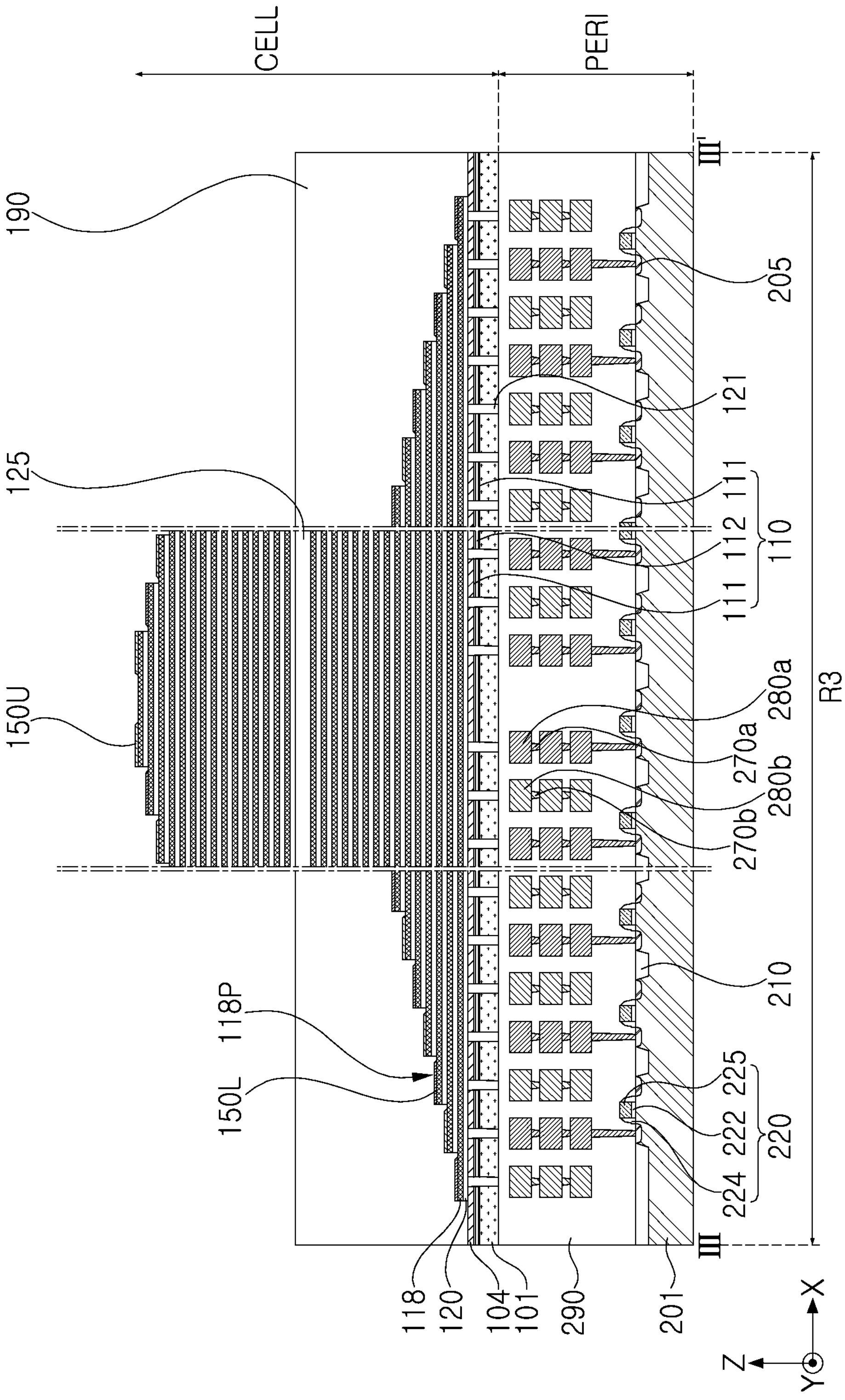

Referring to FIG. 14E, sacrificial insulating layers 118 and interlayer insulating layers 120 forming an upper stack structure may be alternately stacked on the lower stack structure, and then a step structure may be formed, and a second nitride layer 150U may be formed.

In the present operation, a process for the lower stack structure described above with reference to FIGS. 14B and 14C may be performed in the same manner. Accordingly, the second nitride layer 150U may remain only on the sacrificial pad regions 118P.

Figure 14F:
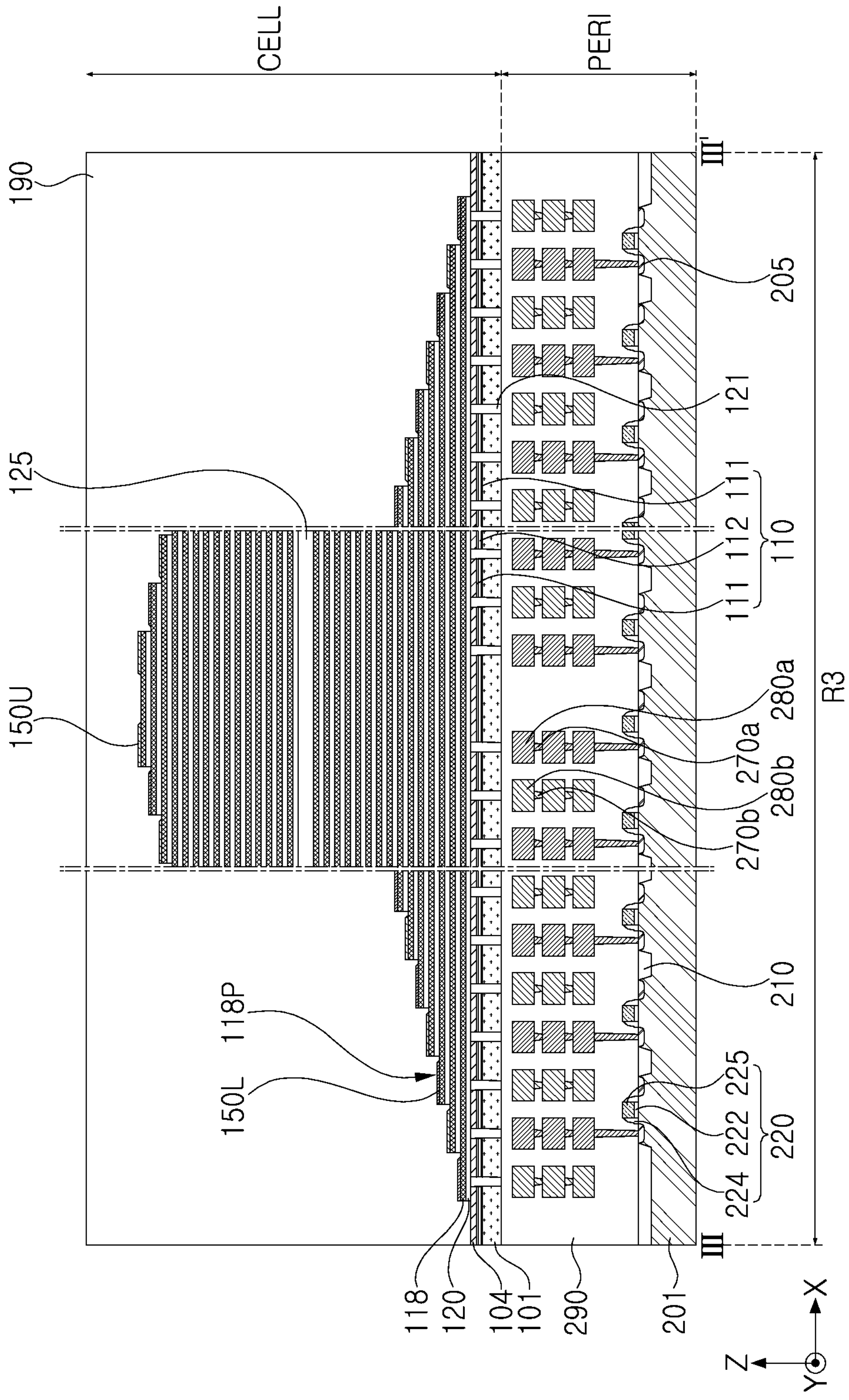

Referring to FIG. 14F, second channel sacrificial layers (not illustrated), passing through the upper stack structure, may be formed.

First, a portion of the cell region insulating layer 190, covering the upper stack structure of the sacrificial insulating layers 118 and the interlayer insulating layers 120, may be formed.

Subsequently, on the first channel sacrificial layers, second channel sacrificial layers may be formed by forming upper channel holes such that upper ends of the first channel sacrificial layers are exposed through the upper stack structure, and then depositing a material forming the second channel sacrificial layers in the upper channel holes. The second channel sacrificial layers may include, for example, polycrystalline silicon.

Figure 14G:
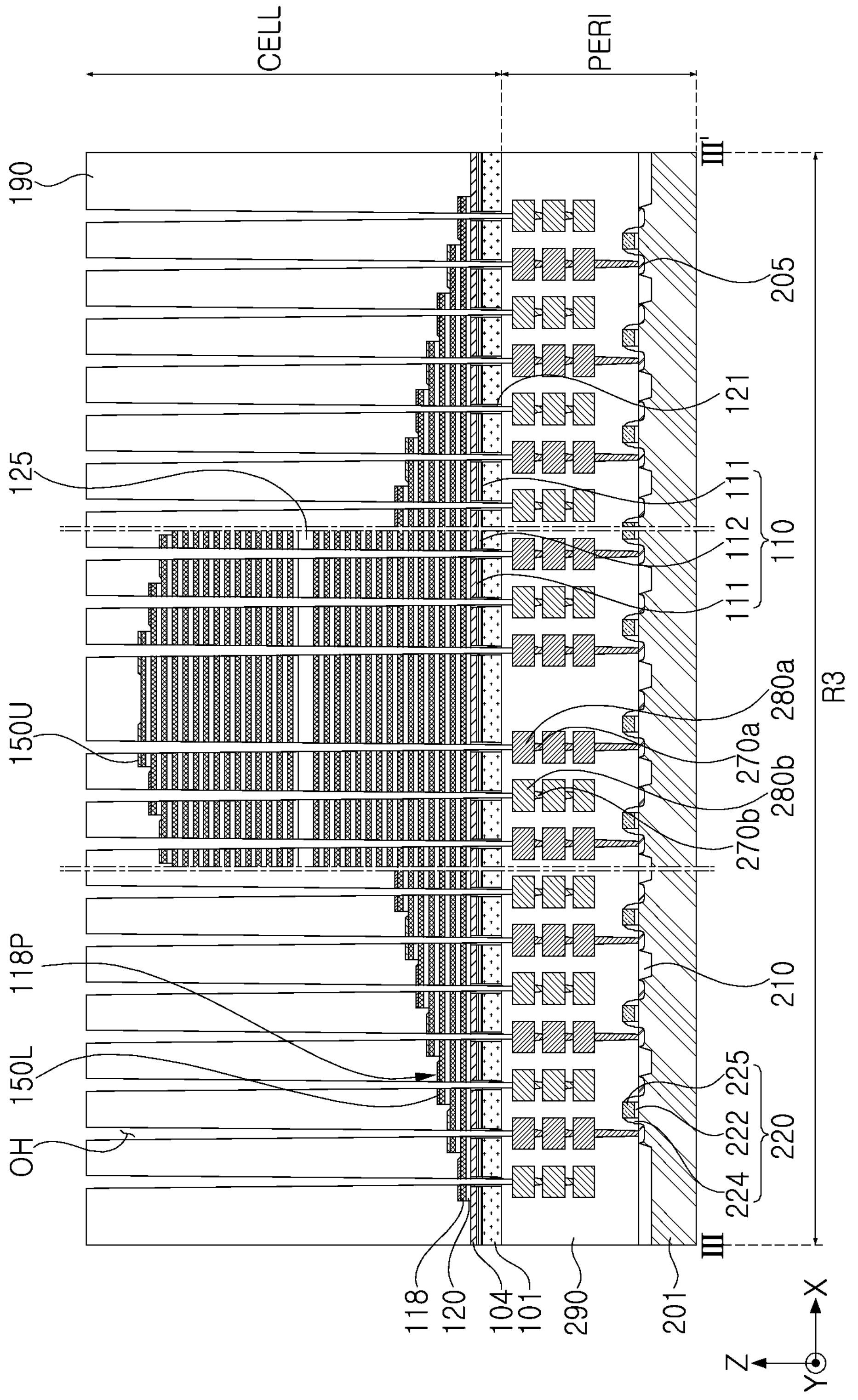

Referring to FIG. 14G, the first and second sacrificial channel layers may be removed and channel structures CH (see FIG. 3) may be formed, and then openings OH may be formed.

First, in the upper stack structure, the sacrificial insulating layers 118 and the interlayer insulating layers 120 may be partially removed to form an upper isolation region SS (see FIG. 4). In order to form the upper isolation region SS, an upper isolation insulating layer 103 (see FIG. 4) may be formed by exposing a region in which the upper isolation region SS is to be formed using a mask layer, removing a predetermined number of sacrificial insulating layers 118 and interlayer insulating layers 120 from an uppermost portion thereof, and then depositing an insulating material.

The channel structures CH may be formed by removing the first and second sacrificial channel layers to form channel holes, and then filling the channel holes.

The openings OH may be formed in a region in which the contact plugs 170 of FIG. 6 are to be formed. Before the openings OH are formed, a portion of the cell region insulating layer 190 covering the channel structures CH may be further formed. The openings OH may be in the form of a cylindrical hole, pass through the substrate insulating layer 121 and extend into the peripheral circuit region PERI. The openings OH may extend through the first and second nitride layers 150L and 150U.

Figure 14H:
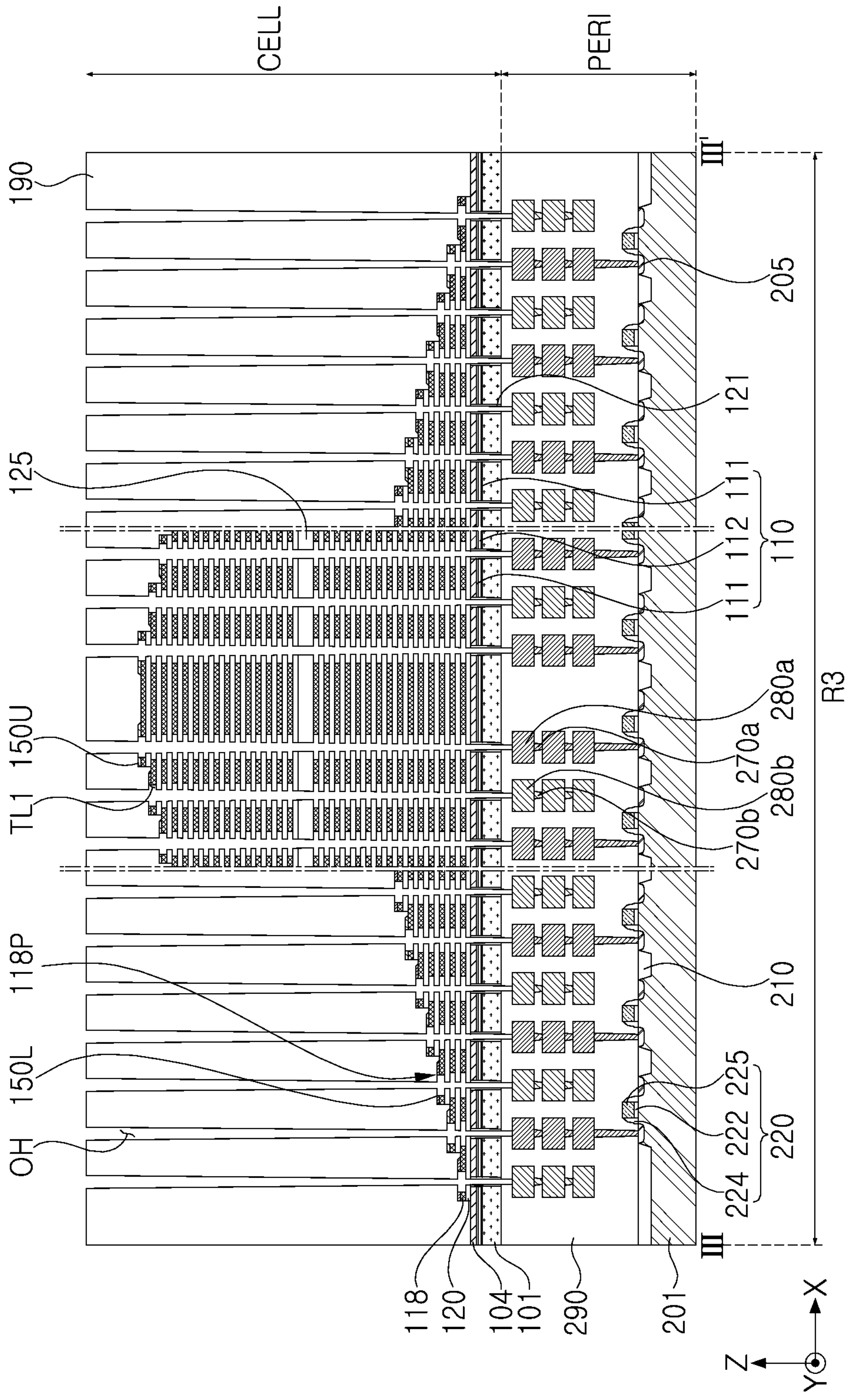

Referring to FIG. 14H, the sacrificial insulating layers 118 and the first and second nitride layers 150L and 150U exposed through the openings OH may be partially removed.

An etchant may be introduced through the openings OH to remove the sacrificial insulating layers 118 and the first and second nitride layers 150L and 150U to a predetermined length around the openings OH, thereby forming tunnel portions TL1. The first tunnel portions TL1 may be formed to be relatively short in the sacrificial pad regions 118P and to be relatively long in the sacrificial insulating layers 118 therebelow.

Specifically, initially, on the contrary, the first tunnel portions TL1 may be relatively long in the sacrificial pad regions 118P. This may be because the first and second preliminary nitride layers 150LP and 150UP have a relatively faster etching rate than that of the sacrificial insulating layers 118. Subsequently, a sacrificial layer may be formed in the openings OH and the first tunnel portions TL1. The sacrificial layer may be formed of a material having an etching rate slower than those of the first and second preliminary nitride layers 150LP and 150UP and the sacrificial insulating layers 118. Subsequently, the sacrificial layer and the sacrificial insulating layers 118 may be partially removed. In this case, the sacrificial layer may remain on an uppermost portion thereof, and the sacrificial layer may be removed from a lower portion thereof, and then the sacrificial insulating layers 118 may be partially removed. Accordingly, the first tunnel portions TL1 may be finally formed to be relatively short in the sacrificial pad regions 118P.

Figure 14I:
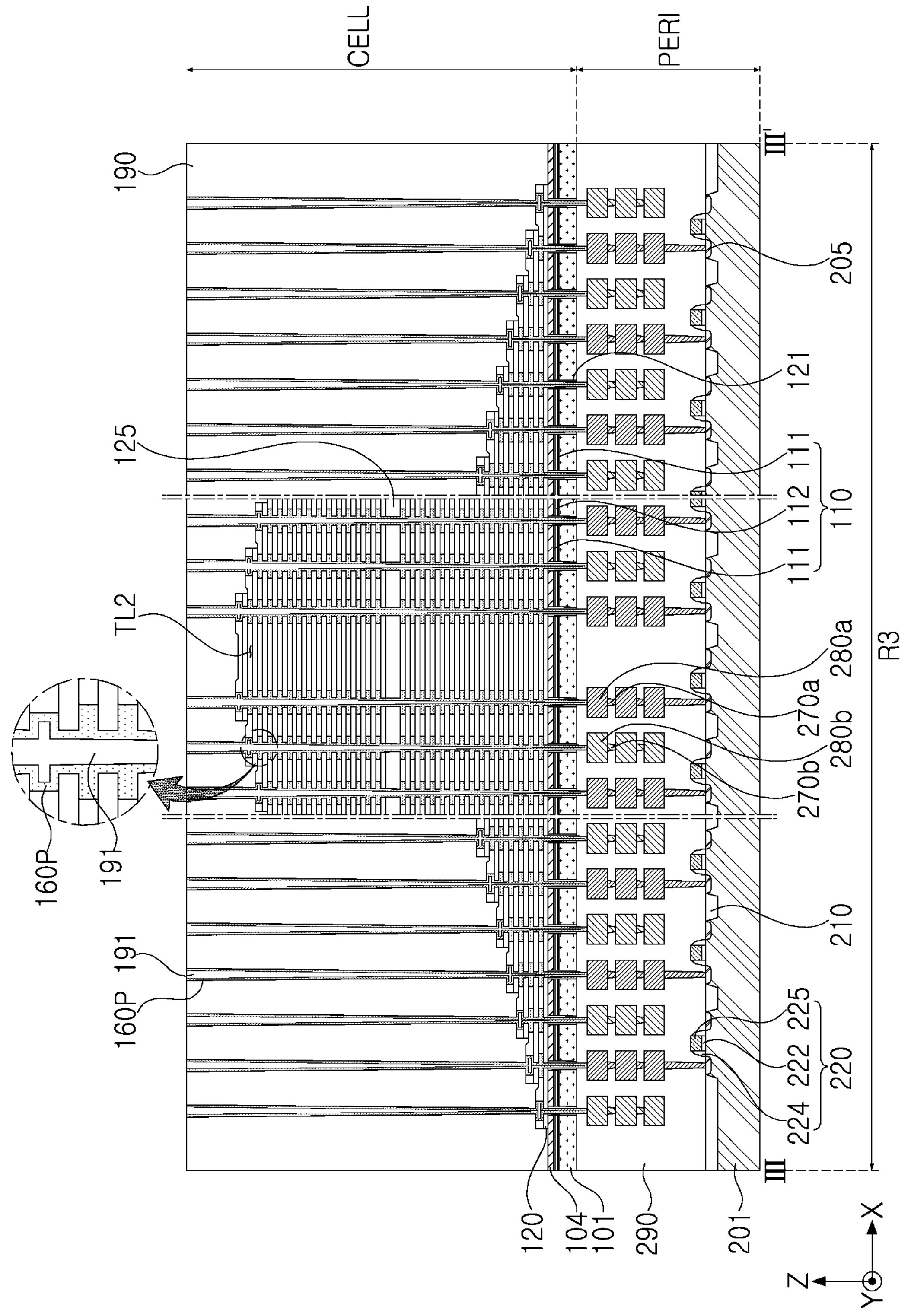

Referring to FIG. 14I, second tunnel portions TL2 may be formed by filling preliminary contact plug insulating layers 160P and vertical sacrificial layers 191 in the first tunnel portions TL1 and the openings OH, and removing the sacrificial insulating layers 118.

First, the preliminary contact plug insulating layers 160P may remain in a subsequent process to form first and second contact plug insulating layers 160 and 165 and first and second through-plug insulating layers 180 and 185. The preliminary contact plug insulating layers 160P may be deposited by, for example, an ALD process. In some embodiments, in an uppermost region of each of step regions, a relatively thick region, that is, a region in which the sacrificial pad regions 118P are partially removed, the preliminary contact plug insulating layers 160P may be formed such that the first tunnel portions TL1 are not completely filled. In a lower region thereof and a region in which the first and second nitride layers 150L and 150U are removed, the preliminary contact plug insulating layers 160P may be formed such that the first tunnel portions TL1 are completely filled.

The vertical sacrificial layers 191 may be formed to fill a remaining space in the openings OH. The vertical sacrificial layers 191 may include a material different from that of the preliminary contact plug insulating layers 160P, for example, polycrystalline silicon.

Subsequently, in positions of first and second isolation regions MS1 and MS2 (see FIG. 2), openings, extending to the second substrate 101 through the sacrificial insulating layers 118 and the interlayer insulating layers 120, may be formed.

The sacrificial insulating layers 118 may be selectively removed with respect to the interlayer insulating layers 120 and the substrate insulating layer 121 using, for example, wet etching. Accordingly, second tunnel portions TL2 may be formed between the interlayer insulating layers 120.

Figure 14J:
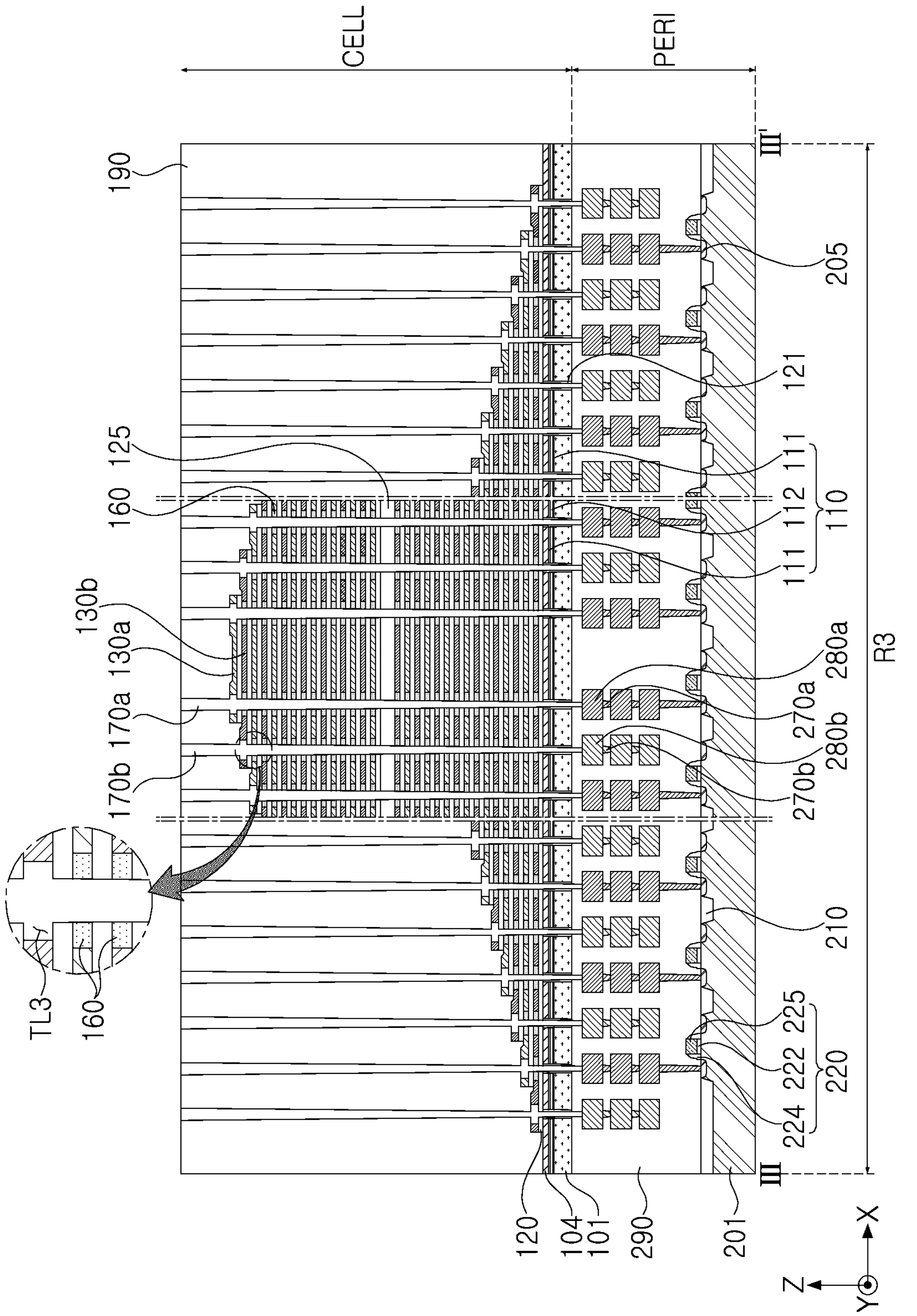

Referring to FIG. 14J, gate electrodes 130 may be formed by filling the second tunnel portions TL2 with a conductive material, and the vertical sacrificial layers 191 may be removed, and then the preliminary contact plug insulating layers 160P may be partially removed.

The conductive material forming the gate electrodes 130 may fill the second tunnel portions TL2. The conductive material may include a metal, polycrystalline silicon or metal silicide material. After the gate electrodes 130 are formed, an isolation insulating layer 105 may be formed in the openings formed in the first and second isolation regions MS1 and MS2.

Subsequently, the vertical sacrificial layers 191 in the openings OH may be selectively removed, such as, for example, by a selective etching process. After the vertical sacrificial layers 191 are removed, the exposed preliminary contact plug insulating layers 160P may be partially removed. In this case, in the pad regions 130P, all of the preliminary contact plug insulating layers 160P may be removed to form third tunnel portions TL3, and the preliminary contact plug insulating layers 160P may remain therebelow to form first contact plug insulating layers 160.

Figure 14K:
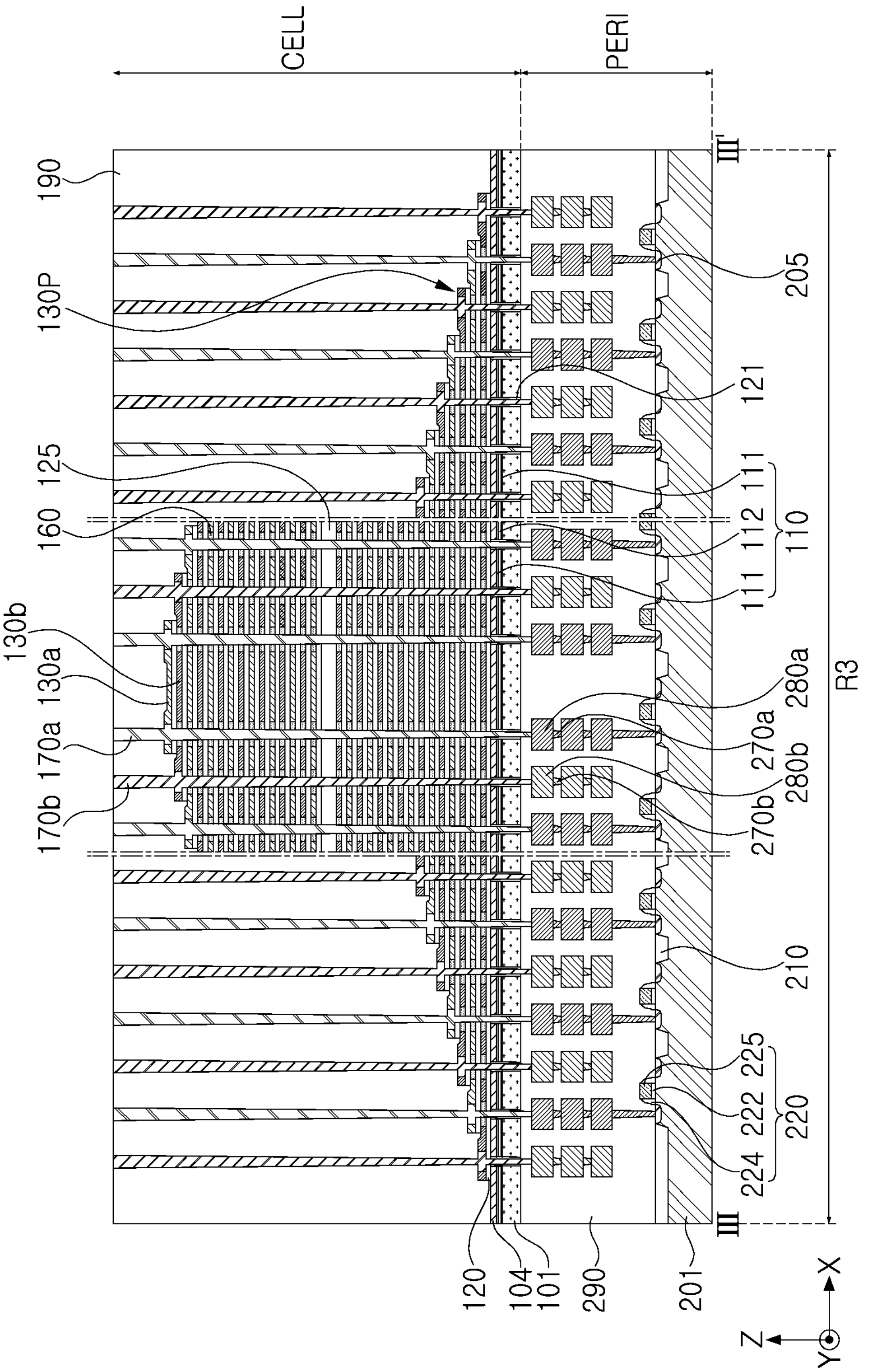

Referring to FIG. 14K, contact plugs 170 may be formed by depositing a conductive material in the openings OH.

The contact plugs 170 may be formed to have a horizontal extension portion in the pad regions 130P, and thus may be physically and electrically connected to the gate electrodes 130.

Subsequently, referring to FIG. 6 together, the semiconductor device 100 may be manufactured by forming cell interconnection lines 195 connected to upper ends of the contact plugs 170.

Figure 15:
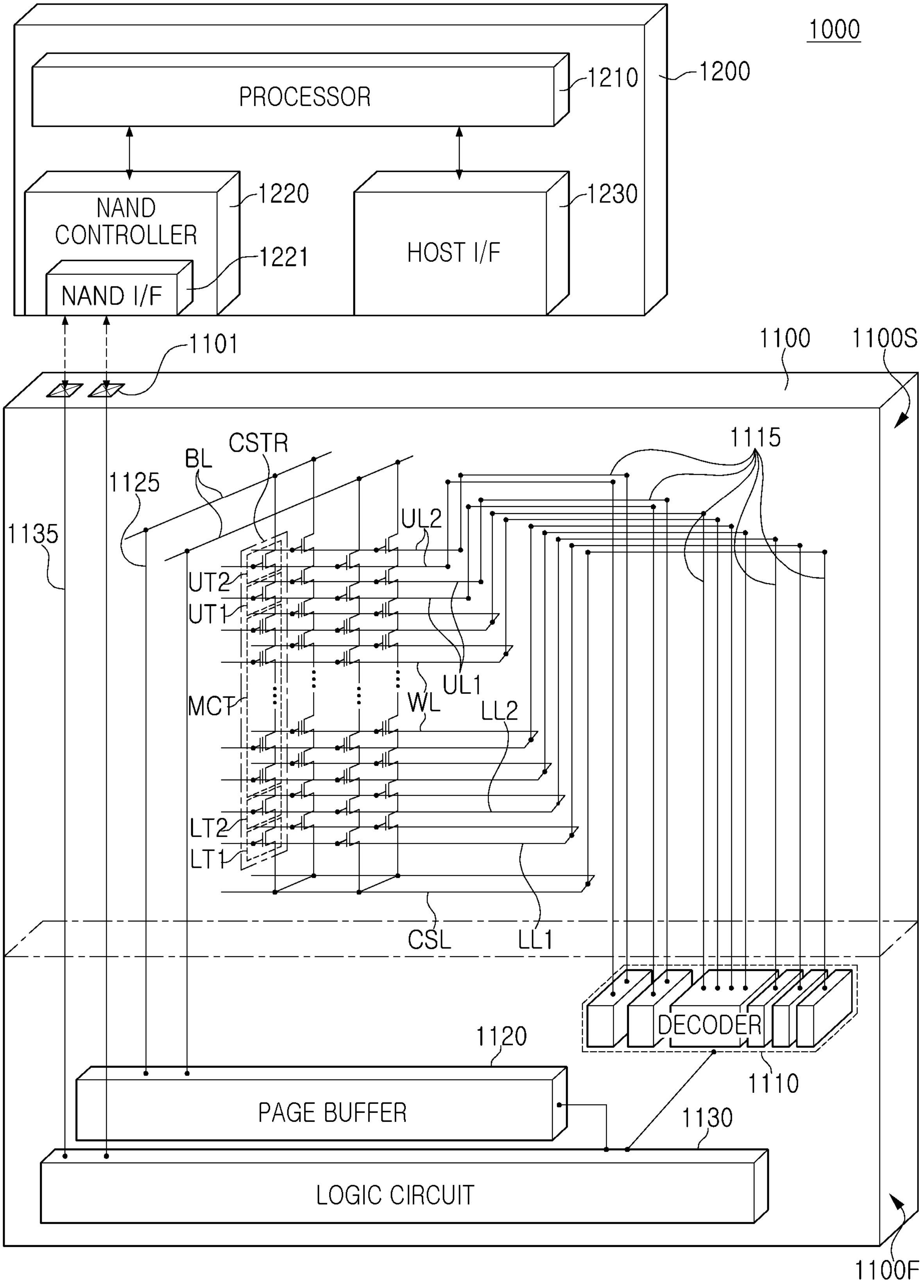
FIG. 15 is a schematic diagram illustrating an electronic system including a semiconductor device according to an example embodiment of the present disclosure.

FIG. 15 is a schematic diagram illustrating an electronic system including a semiconductor device according to an example embodiment of the present disclosure.

Referring to FIG. 15, an electronic system 1000 may include a semiconductor device 1100 and a controller 1200 electrically connected to the semiconductor device 1100. The electronic system 1000 may be a storage device including one or a plurality of semiconductor devices 1100 or an electronic device including the storage device. For example, the electronic system 1000 may be a solid state drive device (SSD), a universal serial bus (USB), a computing system, a medical device, or a communication device including one or a plurality of semiconductor devices 1100. In some example embodiments, the electronic system 1000 may be an electronic system storing data.

The semiconductor device 1100 may be a non-volatile memory device, and may be, for example, a NAND flash memory device described above with reference to FIGS. 1 to 8. The semiconductor device 1100 may include a first structure 1100F and a second structure 1100S on the first structure 1100F. In some example embodiments, the first structure 1100F may be disposed next to the second structure 1100S. The first structure 1100F may be a peripheral circuit structure including a decoder circuit 1110, a page buffer 1120, and a logic circuit 1130. The second structure 1100S may be a memory cell structure including bit lines BL, common source line CSL, word lines WL, first and second gate upper lines UL1 and UL2, first and second gate lower LL1 and LL2, and memory cell strings CSTR between the bit lines BL and the common source line CSL.

In the second structure 1100S, each of the memory cell strings CSTR may include lower transistors LT1 and LT2 adjacent to the common source line CSL, upper transistors UT1 and UT2 adjacent to the bit lines BL, and a plurality of memory cell transistors MCT disposed between the lower transistors LT1 and LT2 and the upper transistors UT1 and UT2. In some example embodiments, the number of lower transistors LT1 and LT2 and the number of upper transistors UT1 and UT2 may be changed in various manners; furthermore, the number of upper transistors need not be the same as the number of lower transistors.

In some example embodiments, the upper transistors UT1 and UT2 may include a string selection transistor, and the lower transistors LT1 and LT2 may include a ground selection transistor (not explicitly shown, but implied). The gate lower lines LL1 and LL2 may be gate electrodes of the lower transistors LT1 and LT2, respectively. The word lines WL may be gate electrodes of the memory cell transistors MCT, and the gate upper lines UL1 and UL2 may be gate electrodes of the upper transistors UT1 and UT2, respectively.

In some example embodiments, the lower transistors LT1 and LT2 may include a lower erase control transistor LT1 and a ground selection transistor LT2 connected in series. The upper transistors UT1 and UT2 may include a string selection transistor UT1 and an upper erase control transistor UT2 connected in series. At least one of the lower erase control transistor LT1 and the upper erase control transistor UT2 may be used for an erase operation of erasing data stored in the memory cell transistors MCT using a GIDL phenomenon.

The common source line CSL, the first and second gate lower lines LL1 and LL2, the word lines WL, and the first and second gate upper lines UL1 and UL2 may be electrically connected to the decoder circuit 1110 through first connection interconnections 1115 extending to the second structure 1100S in the first structure 1100F. The bit lines BL may be electrically connected to the page buffer 1120 through second connection interconnections 1125 extending to the second structure 1100S in the first structure 1100F.

In the first structure 1100F, the decoder circuit 1110 and the page buffer 1120 may perform a control operation on at least one selection memory cell transistor among the plurality of memory cell transistors MCT. The decoder circuit 1110 and the page buffer 1120 may be controlled by the logic circuit 1130. The semiconductor device 1100 may further include at least one input/output pad 1101. The semiconductor device 1100 may communicate with the controller 1200 through the input/output pad 1101 electrically connected to the logic circuit 1130. The input/output pad 1101 may be electrically connected to the logic circuit 1130 through a corresponding input/output connection interconnection 1135 extending to the second structure 1100S in the first structure 1100F.

The controller 1200 may include a processor 1210, a NAND controller 1220, and a host interface 1230. In some example embodiments, the electronic system 1000 may include a plurality of semiconductor devices 1100. In this case, the controller 1200 may control the plurality of semiconductor devices 1100. It is contemplated that in some embodiments, the controller 1200 may include a plurality of control devices configured to perform prescribed operations of the controller in a distributed manner.

The processor 1210 may control the overall operation of the electronic system 1000 including the controller 1200. The processor 1210 may operate according to predetermined firmware and may access the semiconductor device 1100 by controlling the NAND controller 1220. The NAND controller 1220 may include a controller interface 1221 processing communication with the semiconductor device 1100. A control instruction for controlling the semiconductor device 1100, data to be written in the memory cell transistors MCT of the semiconductor device 1100, data to be read from the memory cell transistors MCT of the semiconductor device 110, or the like may be transmitted through the controller interface 1221. The host interface 1230 may provide a communication function between the electronic system 1000 and an external host. When a control instruction is received from the external host through the host interface 1230, the processor 1210 may control the semiconductor device 1100 in response to the control instruction.

Figure 16:
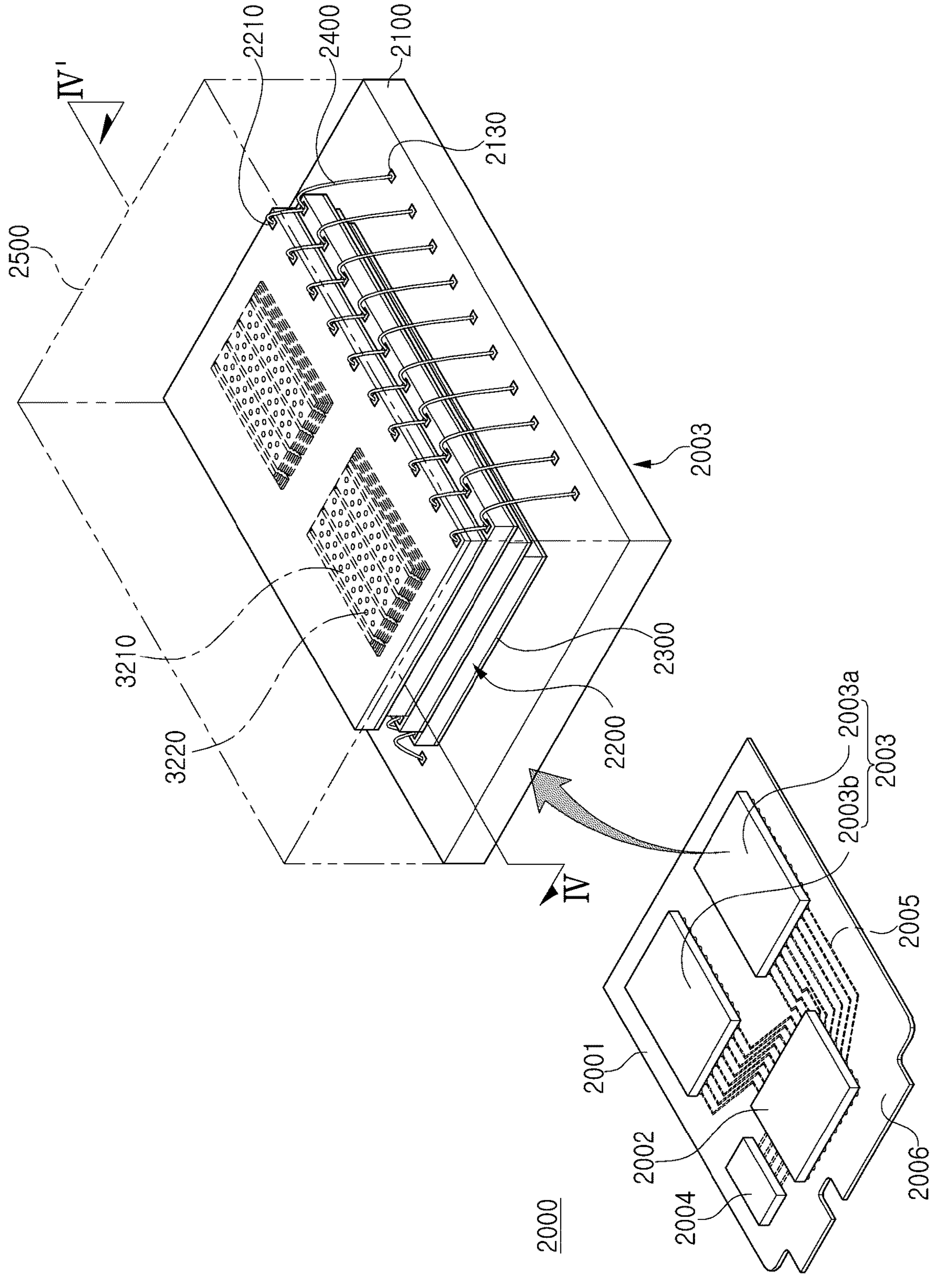
FIG. 16 is a schematic perspective view illustrating an electronic system including a semiconductor device according to an example embodiment of the present disclosure.

FIG. 16 is a schematic perspective view illustrating an electronic system including a semiconductor device according to an example embodiment of the present disclosure.

Referring to FIG. 16, an electronic system 2000 according to an example embodiment of the present disclosure may include a main substrate 2001, a controller 2002 mounted on the main substrate 2001, one or more semiconductor packages 2003, and a DRAM 2004. The semiconductor package 2003 and the DRAM 2004 may be connected to the controller 2002 through interconnection patterns 2005 formed on the main substrate 2001.

The main substrate 2001 may include a connector 2006 including a plurality of pins coupled to an external host. The number and arrangement of the plurality of pins in the connector 2006 may vary depending on a communication interface between the electronic system 2000 and the external host. In some example embodiments, the electronic system 2000 may communicate with the external host according to one of interfaces such as universal serial bus (USB), peripheral component interconnect express (PCI-express), serial advanced technology attachment (SATA), M-Phy for universal flash storage (UFS), and the like. In some example embodiments, the electronic system 2000 may operate by power supplied from the external host through the connector 2006. The electronic system 2000 may further include a power management integrated circuit (PMIC) distributing power supplied from the external host to the controller 2002 and the semiconductor package 2003.

The controller 2002 may write data in the semiconductor package 2003 or read data from the semiconductor package 2003, and may improve operating speed of the electronic system 2000.

The DRAM 2004 may be a buffer memory for alleviating a speed difference between the semiconductor package 2003 and the external host. The semiconductor package 2003 is a space for data storage. The DRAM 2004 included in the electronic system 2000 may also operate as a type of cache memory, and may provide a space for temporarily storing data in a control operation for the semiconductor package 2003. When the electronic system 2000 includes the DRAM 2004, the controller 2002 may further include a DRAM controller for controlling the DRAM 2004 in addition to the NAND controller for controlling the semiconductor package 2003.

The semiconductor package 2003 may include first and second semiconductor packages **2003*a* and 2003*b* spaced apart from each other. Each of the first and second semiconductor packages 2003*a* and 2003*b* may be a semiconductor package including a plurality of semiconductor chips 2200. Each of the first and second semiconductor packages 2003*a* and 2003*b* may include a package substrate 2100, semiconductor chips 2200 on the package substrate 2100, adhesive layers 2300 disposed on a lower surface of each of the semiconductor chips 2200, a connection structure 2400 electrically connecting the semiconductor chips 2200 and the package substrate 2100 to each other, and a molding layer 2500 covering the semiconductor chips 2200 and the connection structure 2400 on the package substrate 2100**.

The package substrate 2100 may be a printed circuit board including package upper pads 2130. Each of the semiconductor chips 2200 may include an input/output pad 2210. The input/output pad 2210 may correspond to the input/ output pad 1101 of FIG. 15. Each of the semiconductor chips 2200 may include a gate stack structure 3210 and a memory channel structure 3220. Each of the semiconductor chips 2200 may include the semiconductor device described above with reference to FIGS. 1 to 8.

In some example embodiments, the connection structure 2400 may be a bonding wire electrically connecting the input/output pad 2210 and the package upper pads 2130 to each other. Accordingly, in each of the first and second semiconductor packages 2003*a* and 2003*b*, the semiconductor chips 2200 may be electrically connected to each other using a bonding wire method, and may be electrically connected to the package upper pads 2130 of the package substrate 2100. In some example embodiments, in each of the first and second semiconductor packages 2003*a* and 2003*b*, the semiconductor chips 2200 may be electrically connected to each other by a connection structure including a through silicon via (TSV), instead of the connection structure 2400 using the bonding interconnection method.

In some example embodiments, the controller 2002 and the semiconductor chips 2200 may be included in one package. In some example embodiments, the controller 2002 and the semiconductor chips 2200 may be mounted on an interposer substrate different from the main substrate 2001, and the controller 2002 and the semiconductor chips 2200 may be connected to each other by an interconnection formed on the interposer substrate.

Figure 17:
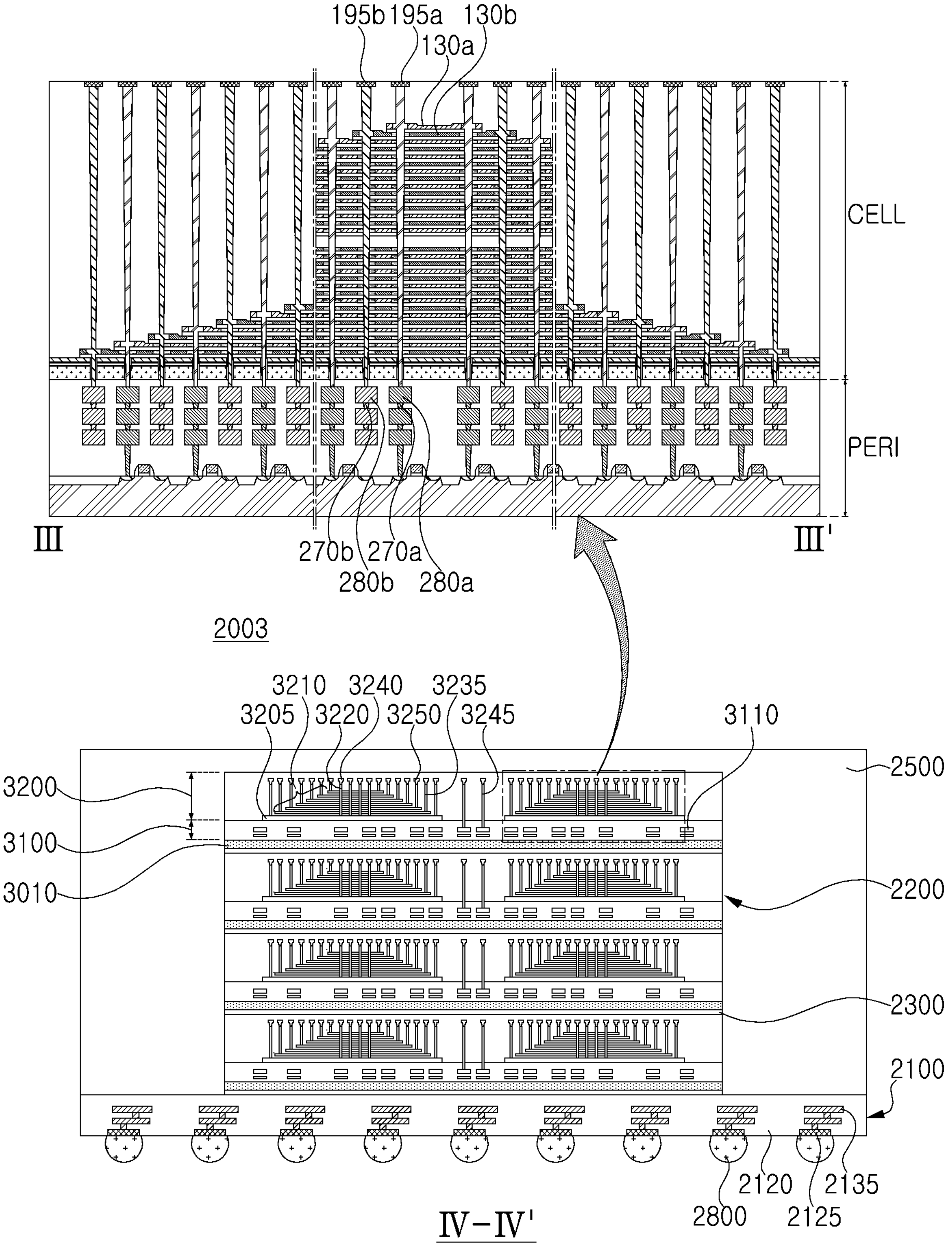
FIG. 17 is a schematic cross-sectional view illustrating a semiconductor package according to an example embodiment of the present disclosure.

FIG. 17 is a schematic cross-sectional view illustrating a semiconductor package according to an example embodiment of the present disclosure. FIG. 17 illustrates an example embodiment of the semiconductor package 2003 of FIG. 16 and schematically illustrates a region of the semiconductor package 2003 of FIG. 16 taken along line IV-IV'.

Referring to FIG. 17, in the semiconductor package 2003, the package substrate 2100 may be a printed circuit board. The package substrate 2100 may include a package substrate body 2120, package upper pads 2130 (see FIG. 16) disposed on an upper surface of the package substrate body 2120, and package lower pads 2125 disposed on a lower surface of the package substrate body 2120 or exposed through the lower surface, and internal interconnections 2135 electrically connecting the package upper pads 2130 and the package lower pads 2125 to each other in the package substrate body 2120. The package upper pads 2130 may be electrically connected to connection structures 2400. The lower pads 2125 may be connected to interconnection patterns 2005 of a main substrate 2001 of an electronic system 2000 through conductive connection portions 2800, as illustrated in FIG. 16.

Each of the semiconductor chips 2200 may include a semiconductor substrate 3010, and a first structure 3100 and a second structure 3200 sequentially stacked on the semiconductor substrate 3010. The first structure 3100 may include a peripheral circuit region including peripheral interconnections 3110. The second structure 3200 may include a common source line 3205, a gate stack structure 3210 on the common source line 3205, memory channel structures 3220 and isolation regions passing through the gate stack structure 3210, bit lines 3240 electrically connected to the memory channel structures 3220, and gate contact plugs 3235 electrically connected to word lines WL (see FIG. 15) of the gate stack structure 3210.

Each of the semiconductor chips 2200 may include a through-interconnection 3245 electrically connected to the peripheral interconnections 3110 of the first structure 3100 and extending into the second structure 3200. The through-interconnection 3245 may be disposed on an outside of the gate stack structure 3210, and may further be disposed to pass through the gate stack structure 3210. Each of the semiconductor chips 2200 may further include an input/output pad 2210 (see FIG. 16) electrically connected to the peripheral interconnections 3110 of the first structure 3100.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Spatially descriptive terms such as "above," "below," "upper" and "lower" may be used herein to indicate a position of elements, structures or features relative to one another as illustrated in the figures, rather than absolute positioning. Thus, the semiconductor device may be otherwise oriented (e.g., rotated 90 degrees or at other orientations), and the spatially relative descriptions used herein may be interpreted accordingly.

It will also be understood that when an element such as a layer, region or substrate is referred to as being "atop," "above," "on" or "over" another element, it is broadly intended that the element be in direct contact with the other element or intervening elements can also be present. In contrast, when an element is referred to as being "directly on" or "directly over" another element, it is intended that there are no intervening elements present. Likewise, it should be appreciated that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

While example embodiments have been shown and described above, it will be apparent to those skilled in the art that modifications and variations could be made without departing from the scope of the present disclosure as defined by the appended claims.

What is claimed is:

1. A semiconductor device comprising:

a first semiconductor structure including a substrate, circuit elements on the substrate, a lower interconnection structure including a first lower interconnection structure and a second lower interconnection structure electrically connected to the circuit elements, the first lower interconnection structure and the second lower interconnection structure having different electric potentials, and a peripheral region insulating layer on the circuit elements; and a second semiconductor structure including gate electrodes including a first gate electrode and a second gate electrode spaced apart from each other and stacked on a substrate of the second semiconductor structure in a first direction, the first gate electrode and the second gate electrode having different electric potentials, interlayer insulating layers alternately stacked with the gate electrodes, contact plugs including a first contact plug and a second contact plug passing through the gate electrodes and extending into the first semiconductor structure in the first direction, the first contact plug and the second contact plug having different electric potentials, and contact plug insulating layers alternately disposed with the interlayer insulating layers, the contact plug insulating layers extending around the contact plugs, wherein the second semiconductor structure further includes:

a first capacitor structure including the first gate electrode, at least one of the contact plug insulating layers, and the second contact plug, or including the second gate electrode, at least one of the contact plug insulating layers, and the first contact plug; and a second capacitor structure including the first gate electrode, at least one of the interlayer insulating layers, and the second gate electrode, and wherein the first semiconductor structure further includes:

a third capacitor structure including the first lower interconnection structure, the peripheral region insulating layer, and the second lower interconnection structure.

2. The semiconductor device of claim 1, wherein:

the first lower interconnection structure is electrically connected to the first contact plug, and the second lower interconnection structure is electrically connected to the second contact plug.

3. The semiconductor device of claim 1, wherein:

the first lower interconnection structure, the first gate electrode, and the first contact plug have a first electric potential, and the second lower interconnection structure, the second gate electrode, and the second contact plug have a second electric potential different from the first electric potential.

4. The semiconductor device of claim 3, wherein the second semiconductor structure further includes:

a first cell interconnection line electrically connected to the first contact plug, the first cell interconnection line having the first electric potential; and a second cell interconnection line electrically connected to the second contact plug, the second cell interconnection line having the second electric potential.

5. The semiconductor device of claim 1, wherein:

the first lower interconnection structure further includes a first circuit contact plug and a first circuit interconnection line, the second lower interconnection structure further includes a second circuit contact plug and a second circuit interconnection line, and the third capacitor structure further includes:

a contact capacitor structure including the first circuit contact plug, the peripheral region insulating layer, and the second circuit contact plug; and an interconnection capacitor structure including the first circuit interconnection line, the peripheral region insulating layer, and the second circuit interconnection line.

6. The semiconductor device of claim 1, wherein the second semiconductor structure further includes dummy channel structures passing through the gate electrodes, extending in the first direction, and arranged around the contact plugs.

7. The semiconductor device of claim 1, wherein the second semiconductor structure further includes an isolation region extending in a second direction, perpendicular to the first direction, between the contact plugs.

8. The semiconductor device of claim 1, wherein:

the gate electrodes include a pad region having an upper surface, and each of at least a subset of the gate electrodes has a thickness in the pad region greater than a thickness in a region of the gate electrodes other than the pad region.

9. The semiconductor device of claim 1, wherein:

the gate electrodes include a pad region having an upper surface, and each of at least a subset of the gate electrodes has a thickness in the pad region substantially the same as a thickness in a region of the gate electrodes other than the pad region.

10. The semiconductor device of claim 1, wherein:

the second semiconductor structure further includes a substrate insulating layer disposed between the lower interconnection structure and the gate electrodes, the substrate insulating layer includes a first portion extending around the first contact plug and a second portion extending around the second contact plug, and the first portion and the second portion are spaced apart from each other.

11. The semiconductor device of claim 1, wherein:

the second semiconductor structure further includes a substrate insulating layer disposed between the lower interconnection structure and the gate electrodes, the substrate insulating layer includes a first portion extending around the first contact plug and a second portion extending around the second contact plug, and the first portion and the second portion are integrally connected to each other.

12. The semiconductor device of claim 11, wherein the second semiconductor structure further includes a fourth capacitor structure including the first contact plug, the substrate insulating layer, and the second contact plug.

13. A semiconductor device comprising:

a first semiconductor structure including circuit elements disposed on a first substrate, a lower interconnection structure electrically connected to the circuit elements, and a peripheral region insulating layer on the circuit elements; and a second semiconductor structure including a second substrate on the first substrate, a first stack structure including a first gate electrode and a second gate electrode spaced apart from each other and stacked on the second substrate in a first direction, the first gate electrode and the second gate electrode having different electric potentials, interlayer insulating layers alternately stacked with the first and second gate electrodes, contact plugs including a first contact plug and a second contact plug passing through the first and second gate electrodes, the first contact plug and the second contact plug having different electric potentials, and contact plug insulating layers alternately disposed with the interlayer insulating layers, the contact plug insulating layers extending around the contact plugs, wherein the second semiconductor structure further includes a first capacitor structure including the first gate electrode, at least one of the contact plug insulating layers, and the second contact plug, or the second gate electrode, at least one of the contact plug insulating layers, and the first contact plug.

14. The semiconductor device of claim 13, wherein the second semiconductor structure further includes a second capacitor structure including the first gate electrode, at least one of the interlayer insulating layers, and the second gate electrode.

15. The semiconductor device of claim 13, wherein the second semiconductor structure further includes:

a second stack structure spaced apart from the first stack structure, the second stack structure including memory gate electrodes; and channel structures passing through the second stack structure.

16. The semiconductor device of claim 13, wherein:

the first semiconductor structure further includes a first bonding structure electrically connected to the lower interconnection structure, the second semiconductor structure further includes a second bonding structure electrically connected to the contact plugs, and the first bonding structure is bonded to the second bonding structure.

17. The semiconductor device of claim 13, wherein:

the first and second gate electrodes and the contact plugs include a metal material, respectively, and the interlayer insulating layers and the contact plug insulating layers include an insulating material, respectively.

18. The semiconductor device of claim 13, wherein inner surfaces of the contact plug insulating layers extend around the contact plugs, and the first and second gate electrodes extend around outer surfaces of the contact plug insulating layers.

19. An electronic system comprising:

a semiconductor device including a first semiconductor structure including circuit elements on a first substrate, a lower interconnection structure electrically connected to the circuit elements, and a peripheral region insulating layer on the circuit elements; and a second semiconductor structure including a second substrate on the first substrate, a first stack structure including a first gate electrode and a second gate electrode spaced apart from each other and stacked on the second substrate in a first direction, the first gate electrode and the second gate electrode having different electric potentials, interlayer insulating layers alternately stacked with the first and second gate electrodes, contact plugs including a first contact plug and a second contact plug passing through the first and second gate electrodes, the first contact plug and the second contact plug having different electric potentials, contact plug insulating layers alternately disposed with the interlayer insulating layers, the contact plug insulating layers extending around the contact plugs, and an input/output pad electrically connected to the circuit elements, wherein the second semiconductor structure further includes a first capacitor structure including the first gate electrode, at least one of the contact plug insulating layers, and the second contact plug, or the second gate electrode, at least one of the contact plug insulating layers, and the first contact plug; and a controller electrically connected to the semiconductor device through the input/output pad, wherein the controller is configured to control the semiconductor device.

20. The electronic system of claim 19, wherein the second semiconductor structure includes a second capacitor structure including the first gate electrode, at least one of the interlayer insulating layers, and the second gate electrode.

* * * * *